United States Patent
Saito

(10) Patent No.: US 11,024,677 B2
(45) Date of Patent: *Jun. 1, 2021

(54) ORGANIC EL DISPLAY APPARATUS AND METHOD OF MANUFACTURING ORGANIC EL DISPLAY APPARATUS

(71) Applicant: Sakai Display Products Corporation, Osaka (JP)

(72) Inventor: Nobuo Saito, Osaka (JP)

(73) Assignee: Sakai Display Products Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/998,661

(22) Filed: Aug. 20, 2020

(65) Prior Publication Data

US 2020/0381491 A1 Dec. 3, 2020

Related U.S. Application Data

(63) Continuation of application No. 15/771,392, filed as application No. PCT/JP2017/024688 on Jul. 5, 2017, now Pat. No. 10,790,338.

(51) Int. Cl.
| | | |
|---|---|---|
| H01L 27/32 | (2006.01) | |
| H01L 51/00 | (2006.01) | |
| H01L 51/56 | (2006.01) | |

(52) U.S. Cl.
CPC ........ H01L 27/3216 (2013.01); H01L 51/001 (2013.01); H01L 51/0011 (2013.01); H01L 51/56 (2013.01)

(58) Field of Classification Search
None
See application file for complete search history.

(56) References Cited

U.S. PATENT DOCUMENTS

| | | | |
|---|---|---|---|
| 10,790,338 B2 * | 9/2020 | Saito | .......... G09F 9/30 |
| 2004/0115339 A1 | 6/2004 | Ito | |

(Continued)

FOREIGN PATENT DOCUMENTS

| | | |
|---|---|---|
| JP | 2007200735 A | 8/2007 |
| JP | 2009048851 A | 3/2009 |

(Continued)

OTHER PUBLICATIONS

English Translation of the International Preliminary Report on Patentability, PCT Application No. PCT/JP2017/024668, dated Jan. 16, 2020.

(Continued)

*Primary Examiner* — Alexander G Ghyka
(74) *Attorney, Agent, or Firm* — Snell & Wilmer L.L.P.

(57) ABSTRACT

An organic-EL display apparatus comprises: a substrate comprising a first electrode; an organic layer formed of organic materials so as to form a plurality of pixels arrayed in a matrix form, the organic material being vapor-deposited on the first electrode; and a second electrode formed on the organic layer. Each of the plurality of pixels comprises at least three sub-pixels having substantially rectangular shapes; a first sub-pixel and a second sub-pixel among the at least three sub-pixels are arranged in parallel with each other such that a long side of the first sub-pixel and a long side of the second sub-pixel are substantially parallel with each other; and a third sub-pixel among the at least three sub-pixels is formed such that a long side of the third sub-pixel is substantially parallel with a short side of the first sub-pixel and a short side of the second sub-pixel. In the first sub-pixel and the second sub-pixel, a variation in a thickness of the organic layer through a long-side direction is larger than a variation in the thickness of the organic layer through a short-side direction; and in the third sub-pixel, a variation in (Continued)

a thickness of the organic layer through a short-side direction is larger than a variation in the thickness of the organic layer through a long-side direction.

13 Claims, 14 Drawing Sheets

(56) References Cited

U.S. PATENT DOCUMENTS

| | | |
|---|---|---|
| 2009/0181163 A1 | 7/2009 | Uetake |
| 2012/0056531 A1 | 3/2012 | Park et al. |
| 2012/0177812 A1 | 7/2012 | Uetake |
| 2013/0299810 A1 | 11/2013 | Sonoda et al. |
| 2013/0302572 A1 | 11/2013 | Sonoda et al. |
| 2016/0013251 A1 | 1/2016 | Yoshida et al. |
| 2018/0301656 A1* | 10/2018 | Ji .................. H01L 51/5275 |
| 2018/0374908 A1 | 12/2018 | Li et al. |
| 2019/0115565 A1 | 4/2019 | Ren et al. |
| 2019/0363279 A1 | 11/2019 | Yamaguchi et al. |
| 2019/0379006 A1 | 12/2019 | Lim et al. |
| 2020/0075893 A1 | 3/2020 | Hu |
| 2020/0144530 A1* | 5/2020 | Kim .................. H01L 51/5056 |
| 2020/0161585 A1* | 5/2020 | Palles-Dimmock ........ H01L 27/322 |
| 2020/0161594 A1 | 5/2020 | Kondo et al. |
| 2020/0243629 A1* | 7/2020 | Kishimoto .......... H01L 27/3246 |
| 2020/0295091 A1* | 9/2020 | Iwasaki .................. H01L 51/56 |

FOREIGN PATENT DOCUMENTS

| | | |
|---|---|---|
| JP | 2009170200 A | 7/2009 |
| WO | 2012099011 A1 | 7/2012 |
| WO | 2012099019 A1 | 7/2012 |
| WO | 2014136149 A1 | 9/2014 |

OTHER PUBLICATIONS

PCT International Search Report, PCT Application No. PCT/JP2017/024668, Japan Patent Office, dated Oct. 10, 2017.

English Translation of PCT International Search Report, PCT Application No. PCT/JP2017/024668, Japan Patent Office, dated Oct. 10, 2017.

* cited by examiner

ORGANIC EL DISPLAY APPARATUS AND METHOD OF MANUFACTURING ORGANIC EL DISPLAY APPARATUS

CROSS-REFERENCE TO RELATED APPLICATIONS

This patent application is a continuation of co-pending U.S. patent application Ser. No. 15/771,392, having a filing/ § 371(c) date of 18 Jul. 2019, which is a U.S. National Stage of International Application No. PCT/JP2017/024668, filed on 5 Jul. 2017 (expired). The entire disclosure of each patent application set forth in the Cross-Reference to Related Applications section is hereby incorporated by reference.

TECHNICAL FIELD

The present invention relates to an organic-EL display apparatus and a method for manufacturing the organic-EL display apparatus.

BACKGROUND ART

In organic-EL display apparatuses, for example, anodes, light-emitting layers, and cathodes are formed on a surface of a substrate formed of glass or a resin film, and an organic-EL display element constituted by an anode, a light-emitting layer, and a cathode is formed in each of a plurality of sub-pixels. The light-emitting layers are formed mainly by depositing an organic material, for example, by vacuum vapor-deposition using a vapor-deposition mask, which comprises openings at positions corresponding to the positions of formation of the light-emitting layers. Since the luminance and chromaticity of the organic-EL display element during light emission and the lifetime of the organic-EL display element are affected by the thickness of the light-emitting layer, the light-emitting layer needs to be formed with a uniform thickness. For example, according to Patent Document 1, the pitch of pixels arrayed in the moving direction of an evaporation source is set larger than the pitch of pixels arrayed in a direction perpendicular to the moving direction of the evaporation source such that portions of the vapor-deposition mask around the openings do not prevent the organic material from reaching to the substrate during evaporation of the organic material.

PRIOR ART DOCUMENT

Patent Document
Patent Document 1: JP 2007-200735 A

SUMMARY OF THE INVENTION

Problem to be Solved by the Invention

Patent Document 1 discloses suppression of a variation in the thickness of the light-emitting layer in the moving direction of an evaporation source. However, a variation of the thickness of the light-emitting layer in the direction orthogonal to the moving direction of the evaporation source can also occur. For example, in the case where a line evaporation source in which melting pots for evaporating the deposition material are linearly arrayed is used, a variation in the thickness of the light-emitting layer in the longitudinal direction of the evaporation source, which is orthogonal to the moving direction of the evaporation source, can sometimes be greater than the variation in the thickness of the light-emitting layer in the moving direction of the evaporation source, as described later. The variation in the thickness of the light-emitting layer occurring in the direction orthogonal to the moving direction of the evaporation source is not considered in the means disclosed in Patent Document 1.

In addition, according to the method disclosed in Patent Document 1, the pitch of the pixels arrayed in either of the horizontal and vertical directions of the screen needs to be set greater than the manufacturable pitch within the inherent capacity of the manufacturing line. Therefore, there is a possibility that the above method cannot sufficiently meet the continuing demands on the organic-EL display apparatus for improvement of the definition and resolution of the image. Further, although the "pixels" in Patent Document 1 are considered to be the "sub-pixels", which emit inherent colors such as red, green, and blue in the case of the organic-EL display apparatus displaying color images, the plurality of "sub-pixels" having rectangular shapes are formed such that the long-side directions of the respective sub-pixels are aligned to an identical direction. Therefore, for example, it is necessary that three sub-pixels 301 to 303, for red, green, and blue, be arranged in parallel, as illustrated in FIG. 12, at a small pitch in one pixel 200 which is downsized with higher-definition in resolution. Thus, in some cases, strict control of condition or a high-performance device is needed in manufacture of the organic-EL display apparatus. Consequently, neither an organic-EL display apparatus nor a manufacturing method for such an organic-EL display apparatus that is easy to manufacture and is little affected by a variation in the thickness of the light-emitting layer without running counter to downsizing or resolution improvement has ever been proposed.

In view of the above, an object of the present invention is to provide an organic-EL display apparatus and a method for manufacturing the organic-EL display apparatus in which manufacturing of sub-pixels is easy even for higher-definition pixels, and the display quality and the like are less affected by a variation in the thickness of the organic layer.

Means to Solve the Problem

An organic-EL display apparatus according to an embodiment of the present invention comprises: a substrate comprising a first electrode; an organic layer formed of organic materials so as to form a plurality of pixels arrayed in a matrix form, the organic material being vapor-deposited on the first electrode; and a second electrode formed on the organic layer, wherein each of the plurality of pixels comprises at least three sub-pixels having substantially rectangular shapes; a first sub-pixel and a second sub-pixel among the at least three sub-pixels are arranged in parallel with each other such that a long side of the first sub-pixel and a long side of the second sub-pixel are substantially parallel with each other; a third sub-pixel among the at least three sub-pixels is formed such that a long side of the third sub-pixel is substantially parallel with a short side of the first sub-pixel and a short side of the second sub-pixel; in the first sub-pixel and the second sub-pixel, a variation in a thickness of the organic layer through a long-side direction is larger than a variation in the thickness of the organic layer through a short-side direction; and in the third sub-pixel, a variation in a thickness of the organic layer through a short-side direction is larger than a variation in the thickness of the organic layer through a long-side direction.

A method for manufacturing organic-EL display apparatus according to an embodiment of the present invention comprises: preparing a first vapor-deposition mask provided with a first opening having a substantially rectangular shape, a second vapor-deposition mask provided with a second opening having a substantially rectangular shape, and a third vapor-deposition mask provided with a third opening having a substantially rectangular shape; overlapping the first vapor-deposition mask with a surface of a target substrate for vapor deposition, positioning the first vapor-deposition mask above a linear evaporation source such that a long side of the first opening and a longitudinal direction of the linear evaporation source are substantially parallel with each other, and vapor-depositing, on the surface, an organic material from the linear evaporation source; overlapping the second vapor-deposition mask with the surface of the target substrate for vapor deposition, positioning the second vapor-deposition mask above the linear evaporation source such that a long side of the second opening and the longitudinal direction of the linear evaporation source are substantially parallel with each other, and vapor-depositing, on the surface, an organic material from the linear evaporation source; and overlapping the third vapor-deposition mask with the surface of the target substrate for vapor deposition, positioning the third vapor-deposition mask above the linear evaporation source such that a short side of the third opening and the longitudinal direction of the linear evaporation source are substantially parallel with each other, and vapor-depositing, on the surface, an organic material from the linear evaporation source.

Effects of the Invention

According to an embodiment of the present invention, an organic-EL display apparatus in which manufacturing of sub-pixels is easy even for small pixels, and the display quality and the like are less affected by a variation in the thickness of the organic layer is provided.

EMBODIMENT FOR CARRYING OUT THE INVENTION

Figure 1:
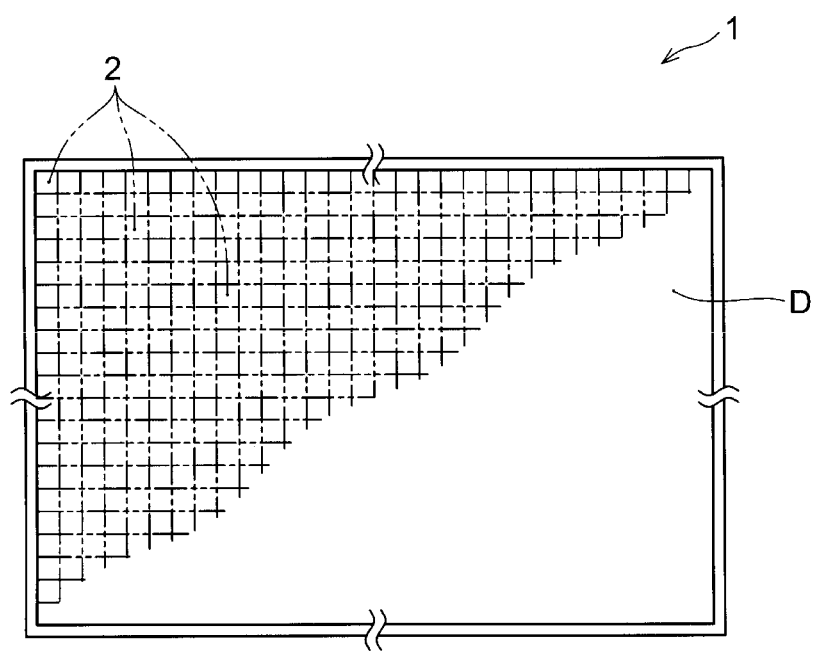
FIG. 1 is a diagram of an organic-EL display apparatus according to Embodiment 1 of the present invention.

Next, referring to the drawings, an organic-EL display apparatus and a method for manufacturing organic-EL display apparatus according to the present invention are explained. However, materials and shapes of respective constituents, and the relative positions thereof in the embodiments explained below are only examples, and the organic-EL display apparatus and the method for manufacturing organic-EL display apparatus according to the present invention are not construed to be limited.

Embodiment 1

Figure 2:
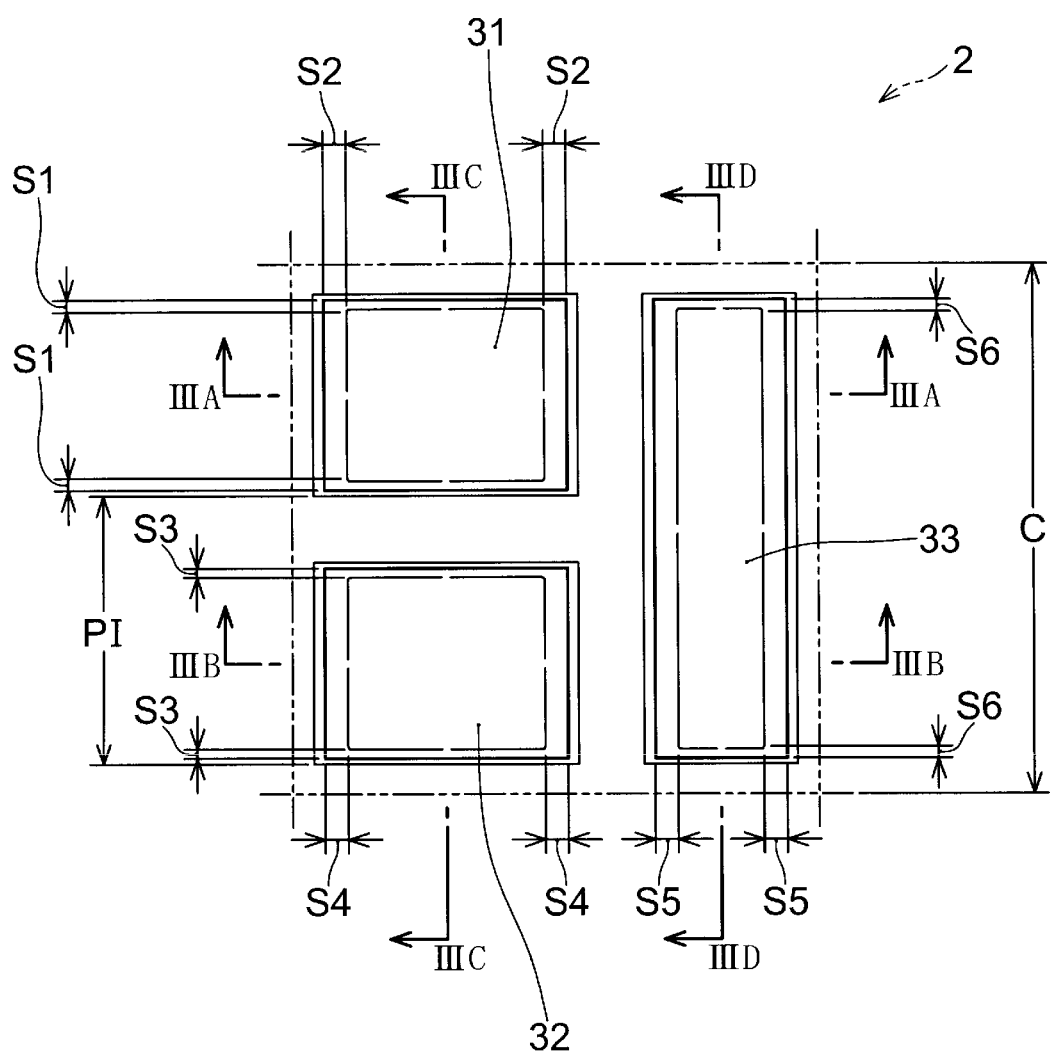
FIG. 2 is a plan view of one pixel of the organic-EL display apparatus according to Embodiment 1 of the present invention.
Figure 7:
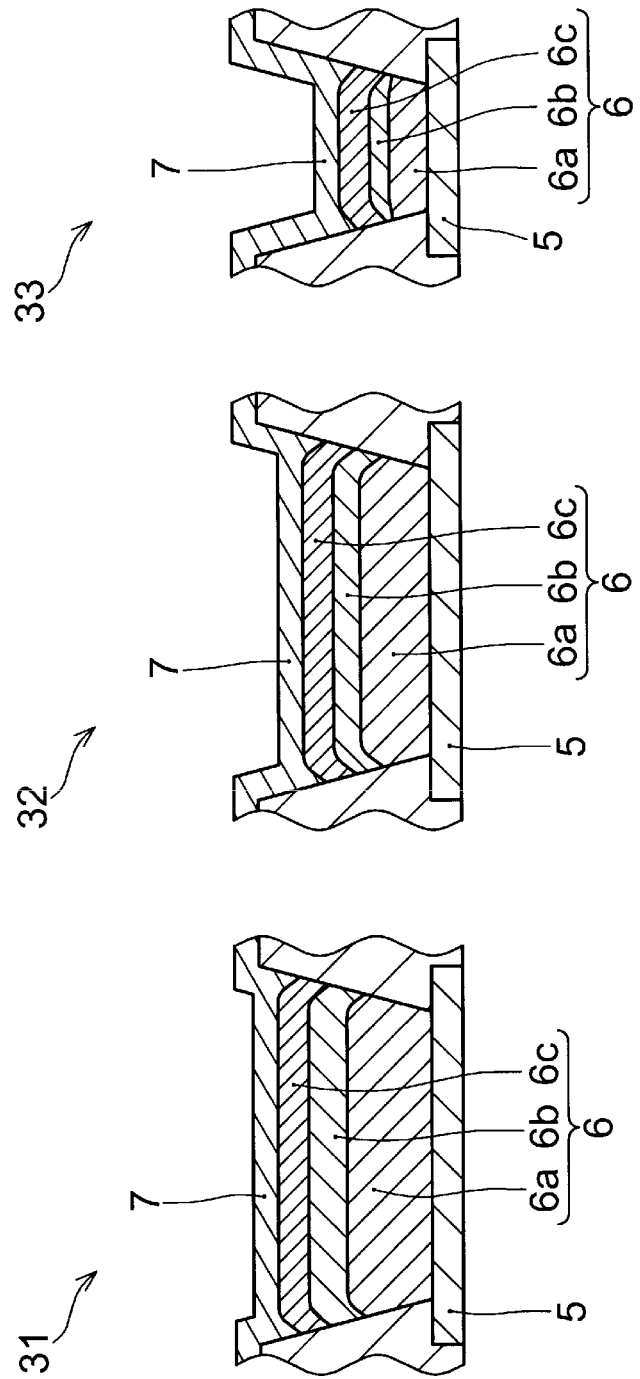
FIG. 7 is a diagram showing, side by side, cross sections of the respective sub-pixels in the organic-EL display apparatus according to Embodiment 1.

FIG. 1 shows a plan view of an organic-EL display apparatus 1 according to Embodiment 1, and FIG. 2 schematically shows a plan view of one of a plurality of pixels 2 provided in the organic-EL display apparatus 1. In addition, FIGS. 3A to 3D are cross-sectional views respectively along IIIA-IIIA to IIID-IIID lines indicated in FIG. 2. As illustrated in FIG. 1, the organic-EL display apparatus 1 comprises a display portion D, which displays images based on video signals generated inside or outside the organic-EL display apparatus 1, and the display portion D comprises the plurality of pixels 2, which are arrayed in a matrix form and have substantially square shapes. As illustrated in FIG. 2, each of the plurality of pixels 2 is constituted by at least three sub-pixels having substantially rectangular shapes. In the example of FIG. 2, the pixel 2 comprises a first sub-pixel 31, a second sub-pixel 32, and a third sub-pixel 33. However, the number of the sub-pixels constituting the pixel 2 is construed to be not limited to three, and each of the plurality of pixels 2 in the present embodiment can have an arbitrary number, three or more, of sub-pixels. As illustrated in FIGS. 3A to 3D, the organic-EL display apparatus 1 comprises: a substrate 4 provided with first electrodes 5; an organic layer 6 formed of organic materials which are vapor-deposited on the first electrodes 5 to form each of the plurality of pixels 2; and a second electrode 7 formed on the organic layer 6. The organic layer 6 comprises a light-emitting layer 6b which emits light as energy emission from an excited luminescent material. (Although not shown in FIG. 3A to 3D, the organic layer 6 can have a multilayer structure comprising the light-emitting layer 6b as illustrated in FIG. 7 described later.) Each of the first to third sub-pixels 31, 32, and 33 emits light from the organic layer 6, for example, by supplying current to the first electrodes 5, so that, as a result, a desired image is displayed on the display portion D in the organic-EL display apparatus 1. In FIG. 2, for clearly showing each sub-pixel, the second electrode 7 is not shown.

The "substantially rectangular shape" is not construed to be limited to rectangles which are surrounded by four straight lines and the interior angles of which are all right angles. As long as the longitudinal direction can be perceived, the "substantially rectangular shape" encompasses, for example, the shape in which all or part of the four edges are slightly curved, and the shape in which all or part of the four corners are rounded.

As illustrated in FIG. 2, the first sub-pixel 31 and the second sub-pixel 32 are arranged in parallel with each other such that the respective long sides of the first sub-pixel 31 and the second sub-pixel 32 are substantially parallel. In other words, the first sub-pixel 31 and the second sub-pixel 32, each having a substantially rectangular shape, are arranged such that one of the two long sides of the first sub-pixel 31 is opposed to one of the two long sides of the second sub-pixel 32. That is, the orientations of the first and second sub-pixels 31 and 32 are aligned such that the long sides of the first sub-pixel 31 and the second sub-pixel 32 extend in an identical direction, and the first and second sub-pixels 31 and 32 are arrayed in the direction orthogonal to the long sides of the first sub-pixel 31 and the second sub-pixel 32.

On the other hand, the third sub-pixel 33 is formed such that the long sides of the third sub-pixel 33 are substantially parallel to a short side of the first sub-pixel 31 and a short side of the second sub-pixel 32. In other words, the third sub-pixel 33 having a substantially rectangular shape is formed such that one of the two long sides of the third sub-pixel 33 is opposed to one of the two short sides of the first sub-pixel 31 and one of the two short sides of the second sub-pixel 32. That is, the third sub-pixel 33 is arranged such that the one of the two long sides of the third sub-pixel 33 is along the one of the two short sides of each of the first sub-pixel 31 and the second sub-pixel 32, and the third sub-pixel 33 is arrayed with each of the first and second sub-pixels 31 and 32 in the long-side direction of the first and second sub-pixels 31 and 32. In addition, in the case where the pixel 2 comprises four or more sub-pixels, sub-pixels other than the first to third sub-pixels 31, 32, and 33 can be arrayed in parallel with one another such that the sub-pixels other than the first to third sub-pixels 31, 32, and 33 are substantially parallel to the first and second sub-pixels 31 and 32, or the sub-pixels other than the first to third sub-pixels 31, 32, and 33 can be formed such that the sub-pixels other than the first to third sub-pixels 31, 32, and 33 are substantially parallel to the third sub-pixel 33.

The expression "substantially parallel" compresses not only the positional relationship being strictly parallel geometrically, and also the positional relationships in which a long side or a short side of one sub-pixel is inclined from any side of the other sub-pixel arranged opposed to the one sub-pixel at such a degree that the long side or the short side of the one sub-pixel is not in contact with a long side or a short side of the other sub-pixel.

Figure 12:
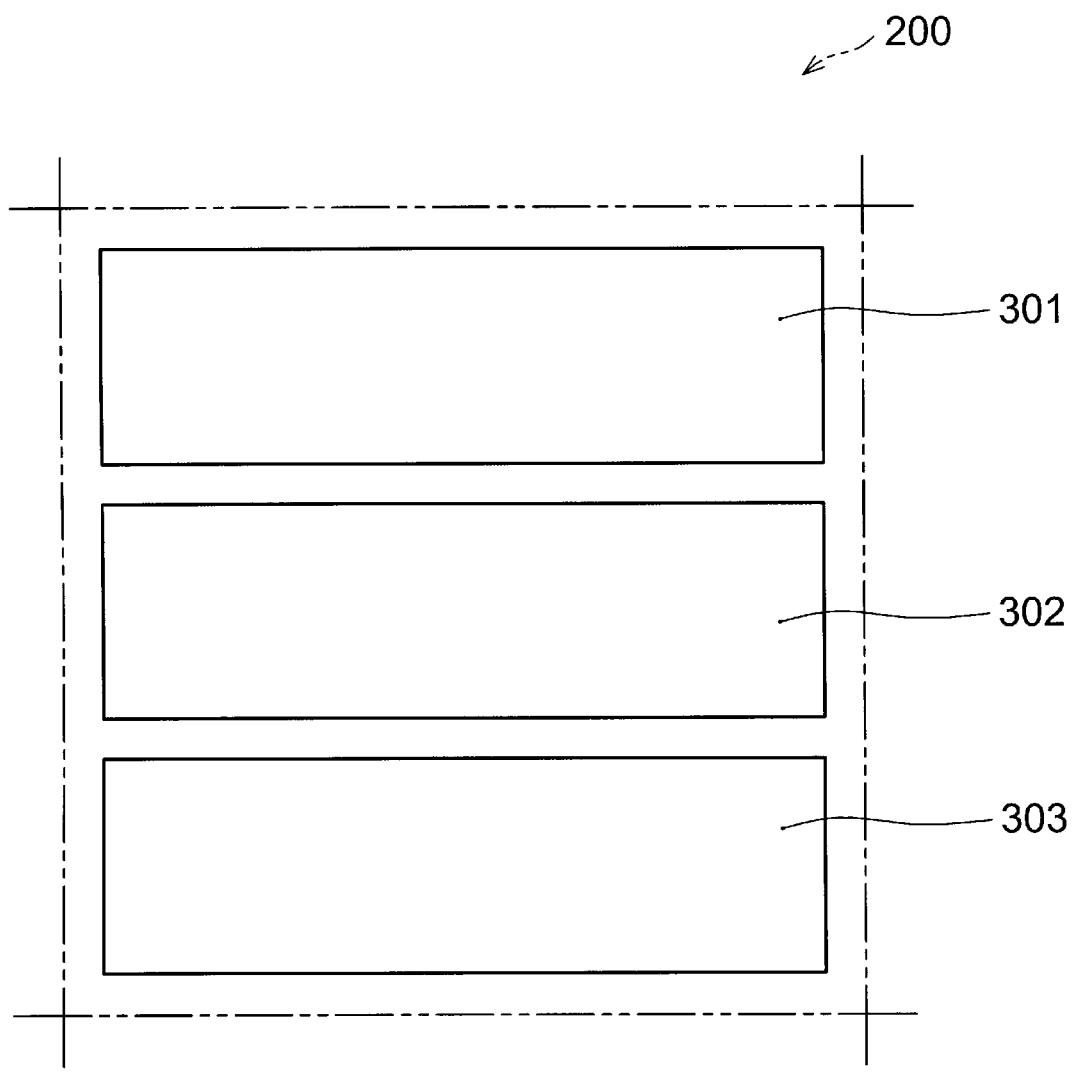
FIG. 12 is a diagram showing an example of a pixel in a conventional organic-EL display apparatus.

As described above, in the present embodiment, not all of the first to third sub-pixels 31, 32, and 33 are arranged in parallel along an identical direction in the pixel 2. That is, at least one sub-pixel is arranged to be arrayed with the other sub-pixels in a direction different from the direction in which the other sub-pixels are arrayed with each other. Even in the case where four or more sub-pixels are provided in the pixel 2, the sub-pixels are arranged in the same manner as above. Therefore, an arrangement pitch PI between the sub-pixels (for example, the first and second sub-pixels 31 and 32) can be set large in comparison with the case where all of the sub-pixels 301 to 303 are arrayed in an identical direction (for example, in the vertical direction in FIG. 12) in the pixel 200 as shown previously in FIG. 12. That is, even in the case where the pixel 2 is downsized, the widths of the first and second sub-pixels 31 and 32 and/or the spacings between the first and second sub-pixels 31 and 32, in the direction in which the first and second sub-pixels 31 and 32 are arrayed, can be set relatively large. Thus, openings 110 (see FIG. 4) in a vapor-deposition mask used in formation of the organic layer 6 can be relatively easily formed, and the positions of the substrate 4 and the vapor-deposition mask can be easily aligned. Further, the influence, on the characteristic features of the organic-EL display apparatus 1, of a variation in the dimensions, the positions, and the like of the first to third sub-pixels 31, 32, and 33, which are caused by a manufacturing variation and the like, can be made relatively small. In other words, a larger variation can be allowed in manufacture of the organic-EL display apparatus 1, so that the organic-EL display apparatus 1 achieving high resolution can be easily manufactured.

The pixel 2 can have arbitrary size according to the screen size and the resolution of the organic-EL display apparatus 1. For example, the pixel 2 can have dimensions of 20 μm square to 500 μm square. The first to third sub-pixels 31, 32, and 33 are arranged with spacings of 5 μm to 50 μm between each other inside the pixel 2 having the dimensions as above. For example, the lengths of the long sides of the first and second sub-pixels 31 and 32 are 0.5×C or more and 0.9×C or less, and the lengths of the short sides of the first and second sub-pixels 31 and 32 are 0.1×C or more and 0.5×C or less, where C is the length of a side of the pixel 2. In addition, the lengths of the long sides of the third sub-pixel 33 are 0.5×C or more and 0.9×C or less, and the lengths of the short sides of the third sub-pixel 33 are 0.1×C or more and 0.5×C or less. The ratio (L1:W3) of the length L1 of the long sides of the first and second sub-pixels 31 and 32 to the length W3 of the short sides of the third sub-pixel 33 is, for example, 1:1 or more and 9:1 or less. However, the lengths of the long sides and short sides of the first to third sub-pixels 31, 32, and 33 are not construed to be limited to the above examples. Unlike the example of FIG. 2, the first sub-pixel 31 and the second sub-pixel 32 can be different in their dimensions, and in their positions in the long-side direction of the first sub-pixel 31 and the second sub-pixel 32. Further, the long side of the first sub-pixel 31 and the short side of the third sub-pixel 33 that face an outer edge of the pixel 2 is not necessarily aligned in the long-side direction of the third sub-pixel 33.

FIGS. 3A to 3D illustrate cross sections of the pixel 2, specifically, cross sections parallel to the long-side direction of the first and second sub-pixels 31 and 32 and cross sections parallel to the long-side direction of the third sub-pixel 33. The organic-EL display apparatus 1 is provided with an insulation bank 8, which is formed of an insulating material and functions as partitions between the respective sub-pixels, and an organic layer 6 is formed in the respective areas surrounded by the insulation bank 8. In the first to third sub-pixels 31, 32, and 33, the organic layer 6 comprises portions S1 to S6 having thickness reduction in the vicinities of both ends in the long-side directions and the short-side directions of the first to third sub-pixels 31, 32, and 33. (Hereinafter, the portions of the organic layer 6 having thickness reduction can be referred to as shadow portions.) The "thickness" of the organic layer 6 is the distance from the upper surface of the first electrode 5 that opposes the organic layer 6 to the upper end (upper surface) of the organic layer 6 that opposes the second electrode 7. Therefore, the expressions "a variation in the thickness" or "a reduction in the thickness" means a variation or a reduction in the height of the upper end of the organic layer 6 from the upper surface of the first electrode 5.

The reason why the shadow portions S1 to S6 are formed in the organic layer 6 in the first to third sub-pixels 31, 32, and 33 is explained below. An example of a vapor-deposition mask 11 used in formation of the organic layer 6 is shown in FIG. 4. The vapor-deposition mask 11 is constituted by a resin film 111, a metal support layer 112 reinforcing the resin film 111, and a frame 113 formed around the resin film 111 and the metal support layer 112 and used for fixing the vapor-deposition mask 11 to a vapor-deposition apparatus (not shown). Openings 110 are arranged in positions of the resin film 111 corresponding to the positions in which the organic layer 6 is to be formed. In addition, openings 112a, which envelopes the openings 110 in the resin film 111, are arranged in the metal support layer 112. When the organic layer 6 is formed, only the organic material passing through the openings 110 reaches the substrate 4 (see FIG. 3A) to form the organic layer 6 in given positions.

Figure 5A:
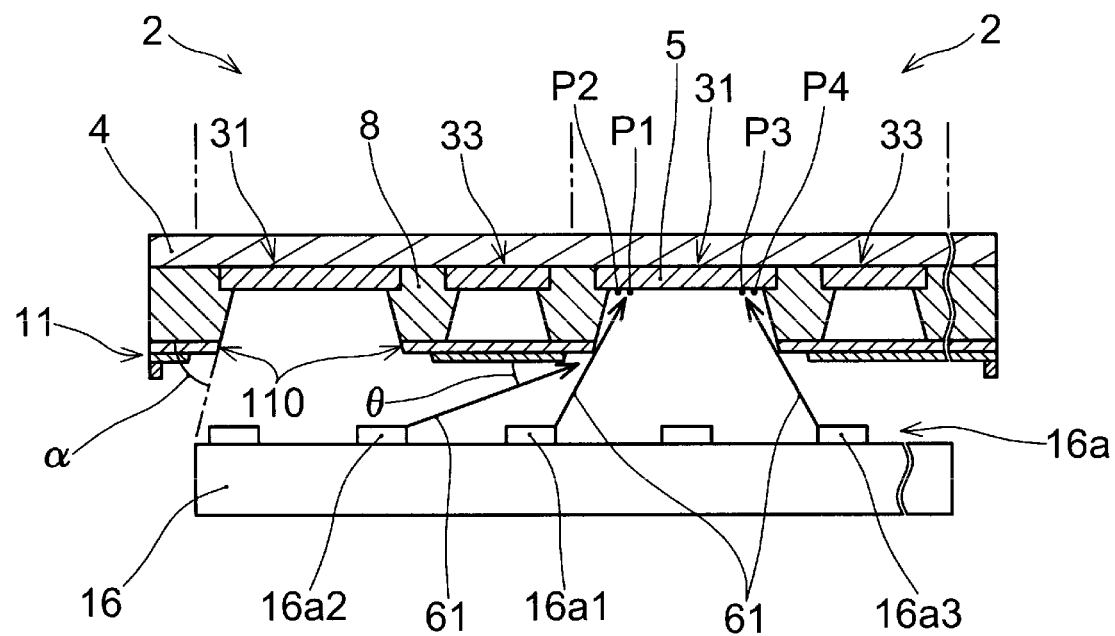
FIG. 5A is a diagram showing circumstances of flight of organic material in the longitudinal direction of the linear evaporation source in a vapor-deposition process.

The substrate 4 and the vapor-deposition mask 11 that have been arranged inside the vapor-deposition apparatus to form the organic layer 6 are shown in FIG. 5A. The first electrodes 5 and the insulation bank 8 are formed on the substrate 4. The cross section of the pixel 2 shown in FIG. 5A is a cross section at a position similar to FIG. 3A. The vapor-deposition mask 11 is a vapor-deposition mask for the first sub-pixel 31, and comprises the openings 110 corresponding to the first sub-pixel 31. The vapor-deposition mask 11 and the substrate 4 are aligned and closely contact with each other such that the openings 110 in the vapor-deposition mask 11 are located right under the areas surrounded by the insulation bank 8. The first electrode 5 arranged in the first sub-pixel 31 is exposed in the openings 110 in the vapor-deposition mask 11. On the other hand, the third sub-pixel 33 is covered by the vapor-deposition mask 11. Although the organic layer 6 is not yet formed and the respective sub-pixels do not yet exist in the structures shown in FIG. 5A and in FIG. 5B which is explained later, the regions in which the first to third sub-pixels 31, 32, and 33 are to be formed will be respectively referred to as the first to third sub-pixels 31, 32, and 33, for convenience, in the explanations with reference to FIGS. 5A and 5B.

A linear evaporation source 16 having a plurality of linearly arrayed melting pots 16a is arranged below the vapor-deposition mask 11. The plurality of melting pots 16a are arranged from one end to the opposite end of the linear evaporation source 16 with proper spacings. The positions and the angles of the melting pots 16a are adjusted such that the evaporated material (organic material) 61 with a certain thickness can be adhered to a strip-like area of the substrate 4 in the longitudinal direction of the linear evaporation source 16. Then, the linear evaporation source 16 moves relative to the substrate 4 in a direction orthogonal to the longitudinal direction of the linear evaporation source 16 (in the back-and-forth direction, which is orthogonal to the plane of the illustration of FIG. 5A) across the full length (or full width) of the substrate 4. Consequently, the organic material 61 is vapor-deposited, ideally in a substantially uniform manner, on the surfaces of the first electrodes 5 excluding the portions covered by the vapor-deposition mask 11 across the entire surface of the substrate 4.

In the longitudinal direction of the linear evaporation source 16, the organic material 61 that comes flying to, for example, the first sub-pixel 31 on the right side in FIG. 5A (hereinafter, when FIG. 5A is referred to, the first sub-pixel on the right side is simply referred to as the first sub-pixel) from not only melting pot 16a2 located in the vicinity of the first sub-pixel 31 but also all other melting pots 16a including the melting pot 16a1 and the melting pot 16a3. However, the incident angle θ of the organic material 61 that comes flying from a melting pot 16a decreases with an increase in the distance of the melting pot 16a from the first sub-pixel 31. The organic material 61 that comes flying at an incident angle θ smaller than a taper angle α of the opening 110 of the vapor-deposition mask 11 or a taper angle of the insulation bank 8 is obstructed by the vapor-deposition mask 11 or the insulation bank 8 and cannot reach the first sub-pixel 31.

For example, although the organic material 61 that comes flying from the melting pot 16a1 reaches the point P1, the organic material 61 that comes flying from melting pot 16a2 cannot reach the point P1. In other words, while the organic material 61 that comes flying from melting pot 16a1 reaches the point P1, it cannot reach the point P2. Similarly, while the organic material 61 that comes flying from melting pot 16a3 reaches the point P3, it cannot reach the point P4. That is, the position in the first sub-pixel 31 is more difficult to be reached by the organic material 61 when the position is nearer to each end of the first sub-pixel 31. This phenomenon similarly occurs in the cases of the organic material 61 that comes flying from other plurality of melting pots 16 that are arrayed in the longitudinal direction of the linear evaporation source 16. Therefore, shadow portions having a relatively large width and greatly reduced thicknesses (e.g., the shadow portions S2 (see FIG. 3A)) occur in vicinities of both ends, in the longitudinal direction of the linear evaporation source 16, of the first sub-pixel 31. In a similar manner, large shadow portions (e.g., the shadow portions S4 and S5 (see FIG. 3B)) occur in vicinities of both ends, in the longitudinal direction of the linear evaporation source 16, of the second and third sub-pixels 32 and 33.

Figure 5B:
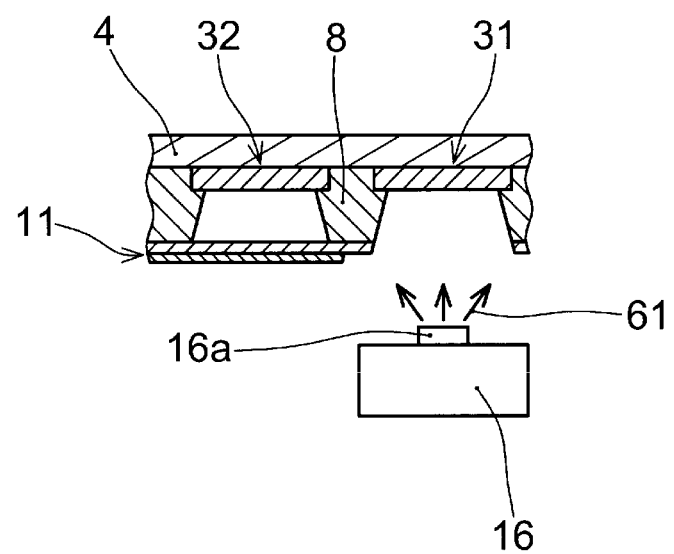
FIG. 5B is a diagram showing circumstances of flight of organic material in the direction of movement of the linear evaporation source in the vapor-deposition process.

On the other hand, in the moving direction of the linear evaporation source 16, perpendicular to the longitudinal direction of the linear evaporation source 16, a portion in which the thickness is greatly reduced is unlikely to occur at both ends of the first to third sub-pixels 31, 32, and 33. This phenomenon is explained below with reference to FIG. 5B. In FIG. 5B, the substrate 4, the vapor-deposition mask 11, and the linear evaporation source 16 which are shown in FIG. 5A are drawn from a viewpoint at the sideward area of the linear evaporation source 16. That is, the linear evaporation source 16 extends in the direction perpendicular to the plane of illustration of FIG. 5B, and moves relative to the substrate 4 in the left-right direction in the plane of illustration of FIG. 5B. The cross section of the pixel 2 shown in FIG. 5B is a cross section at a position similar to FIG. 3C. The second sub-pixel 32 is covered by the vapor-deposition mask 11.

As illustrated in FIG. 5B, the organic material 61 comes flying to the first sub-pixel 31 from a very small extent in the moving direction of the linear evaporation source 16, compared with aforementioned extent in the longitudinal direction of the linear evaporation source 16. Even in the case where more than one melting pot 16a is arrayed in the width direction of the linear evaporation source 16 (the moving direction of the linear evaporation source 16), the organic material 61 comes flying from a very small extent compared with the extent in the longitudinal direction of the linear evaporation source 16. Therefore, the amount of the organic material 61 which comes flying at small incident angles is small, and the amount of the organic material 61 that is blocked by the vapor-deposition mask 11 or the insulation bank 8 is small. Thus, only small shadow portions having a relatively small width and little thickness reduction (e.g., the shadow portions S1 (see FIG. 3C)) occur in vicinities of both ends, in the moving direction of the linear evaporation source 16, of the first sub-pixel 31. Due to similar situations, only small shadow portions having a relatively small width and little thickness reduction (e.g., the shadow portions S3 and S6 (see FIGS. 3C and 3D)) occur in vicinities of both ends, in the moving direction of the linear evaporation source 16, of the second and third sub-pixels 32 and 33.

As explained above, in the organic layer 6 formed by the vapor-deposition process using the linear evaporation source 16, shadow portions (e.g., the shadow portions S2, S4, and S5) occur at both ends, on the long side and the short side, of each of the first to third sub-pixels 31, 32, and 33 having a substantially rectangular shape, where the shadow portions are larger at the ends on one of the long side and the short side than at the ends on the other of the long side and the short side. Hereinbelow, the explanations of the organic-EL display apparatus 1 according to the present embodiment are continued by referring to FIGS. 3A to 3D again.

As illustrated in FIGS. 3A to 3D, in each of the first to third sub-pixels 31, 32, and 33, variations Δt1 to Δt6 of the thickness of the organic layer 6 in the long-side direction and the short-side direction of each sub-pixel occur mainly due to the shadow portions S1 to S6. Specifically, in the first sub-pixel 31, the variation Δt2 of the thickness of the organic layer 6 in the long-side direction (the X direction in FIG. 3A) are larger than the variation Δt1 of the thickness of the organic layer 6 in the short-side direction (the X direction in FIG. 3C). Similarly, in the second sub-pixel 32, the variation Δt4 of the thickness of the organic layer 6 in the long-side direction (the X direction in FIG. 3B) are larger than the variation Δt3 of the thickness of the organic layer 6 in the short-side direction (the X direction in FIG. 3C). On the other hand, in the third sub-pixel 33, the variation Δt5 of the thickness of the organic layer 6 in the short-side direction (the X direction in FIG. 3A and FIG. 3B) are larger than the variation Δt6 of the thickness of the organic layer 6 in the long-side direction (the X direction in FIG. 3D). The variation Δt2 or Δt4 of the thickness of the organic layer 6 in the long-side direction in each of the first and second sub-pixels 31 and 32 and the variation Δt5 of the thickness of the organic layer 6 in the short-side direction in the third sub-pixel 33 are substantially 10% of a normal thickness of the organic layer 6 in each sub-pixel. In addition, the variation Δt1 or Δt3 of the thickness of the organic layer 6 in the short-side direction in each of the first and second sub-pixels 31 and 32 and the variation Δt6 of the thickness of the organic layer 6 in the long-side direction in the third sub-pixel 33 are 5% or less of a normal thickness of the organic layer 6 in each sub-pixel. In FIGS. 3A to 3D, the variations Δt1 to Δt6 of the thickness of the organic layer 6 are exaggerated in the illustration with respect to the thickness of the organic layer 6.

As explained above, in the first and second sub-pixels 31 and 32, the shadow portions S2 and S4 exist along the respective short sides and have greater thickness reduction and a larger width than the shadow portions S1 and S3 which exist along the respective long sides. Since the shadow portions S1 to S4 are also portions in which the light-emitting layer 6b is thin, an increase in the area of the shadow portions S1 to S4 having reduced thickness decreases the luminance and the chromaticity of the light emitted from the organic layer 6 and the lifetime. Since, in each of the first and second sub-pixels 31 and 32, the shadow portions S2 and S4 that have great thickness reduction and a large width exist along the short sides that are shorter than the long sides of each sub-pixel, the influence on the luminance and the like is small, compared with the case where such shadow portions exist along the long sides.

As described before, in the formation of the organic layer 6 by using the linear evaporation source 16 (see FIG. 5A), shadow portions that occur at ends in one of a long side and a short side of the first to third sub-pixels 31, 32, and 33 are larger than shadow portions that occur at ends in the other of the long side and the short side. However, it is possible to cause large shadow portions S2 and S4 to occur along short sides that less affect the luminance and the like by performing vapor deposition of organic material in such an arrangement that the long sides of the first and second sub-pixels 31 and 32 are substantially parallel to the longitudinal direction of the linear evaporation source 16.

Unlike the first and second sub-pixels 31 and 32, in the third sub-pixel 33, shadow portions S5 having great thickness reduction and a large width exist along the respective long sides. In the case where vapor deposition of organic material is performed in such an arrangement that the long sides of the first and second sub-pixels 31 and 32 are substantially parallel to the longitudinal direction of the linear evaporation source 16 (see FIG. 5A), in the third sub-pixel 33, relatively large shadow portions S5 are produced along the respective long sides which are parallel to the short sides of each of the first and second sub-pixels 31 and 32. However, as described before, manufacture of the organic-EL display apparatus 1 can be facilitated by arranging the third sub-pixel 33 to be substantially parallel to the short sides of the first and second sub-pixels 31 and 32. In addition, in at least first and second sub-pixels 31 and 32, the influence on the luminance and the like caused by the relatively large shadow portions S2 and S4 can be reduced.

In the present embodiment, when a ratio of a portion of the organic layer 6 formed with a predetermined thickness or more in each sub-pixel to the entirety of each sub-pixel is considered, it can be said that the ratios in the first and second sub-pixels 31 and 32 are larger than the ratio in the third sub-pixel 33. For example, in the present embodiment, an area ratio in the first sub-pixel 31 and an area ratio in the second sub-pixel 32 are larger than an area ratio in the third sub-pixel 33. Each of the area ratios in the first to third sub pixels 31, 32, and 33 is defined as a ratio of an area of a portion to the entire area of each of the first to third sub pixels 31, 32, and 33. The portion is a portion having thicknesses equal to or larger than 95% of the maximum thickness of the organic layer 6 in each of the first to third sub-pixels 31, 32, and 33. This point is specifically explained below with reference to FIG. 6A and FIG. 6B. The "area ratio" is the ratio of the area of the portion of the organic layer 6 having thicknesses equal to or larger than 95% of the maximum thickness of the organic layer 6 to the entire area of each sub-pixel, in a pixel plane on which a plurality of pixels 2 are arrayed in a matrix form.

Figure 6A:
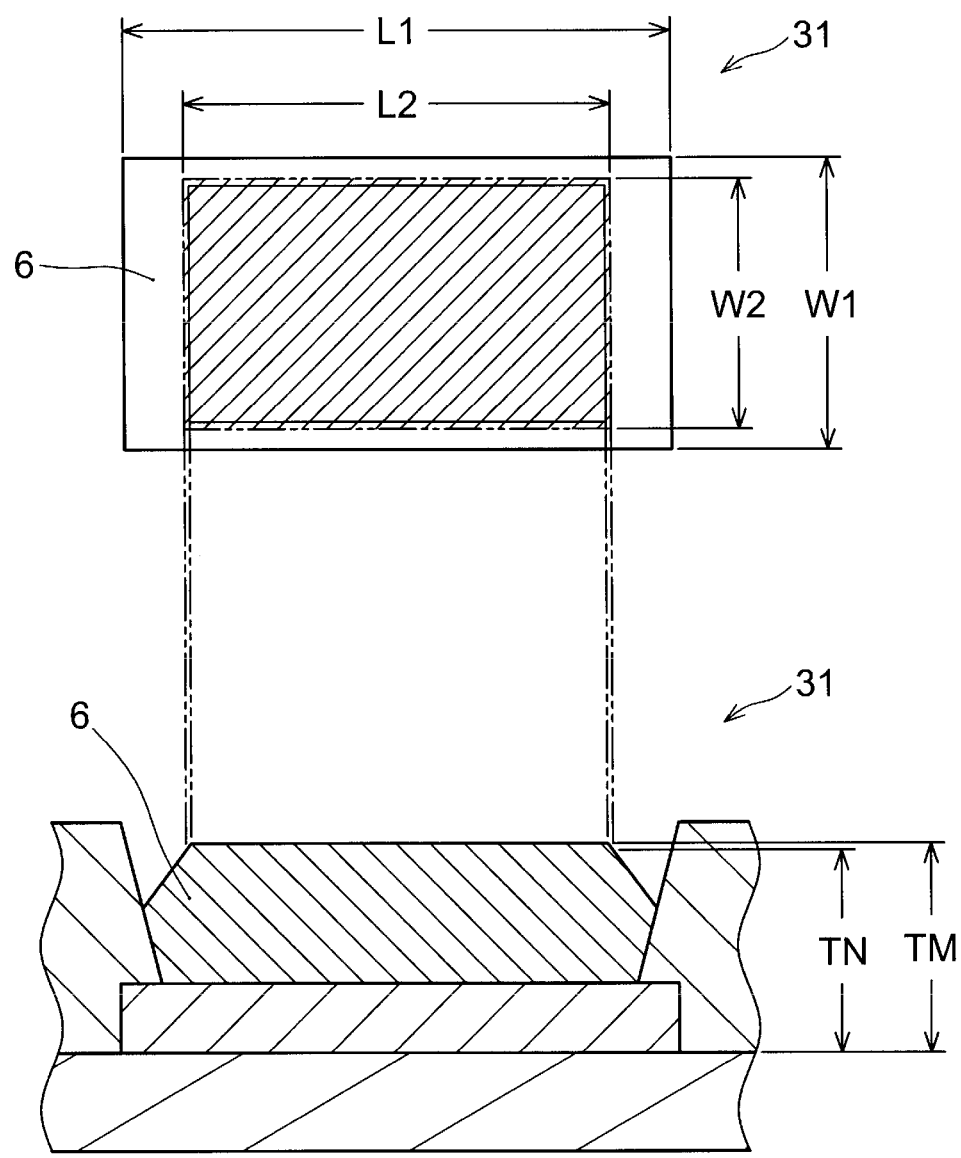
FIG. 6A is a diagram showing a region of the organic layer in the first sub-pixel, the region being formed with thicknesses of 95% or larger of the maximum thickness of the organic layer, in the organic-EL display apparatus according to Embodiment 1.
Figure 6B:
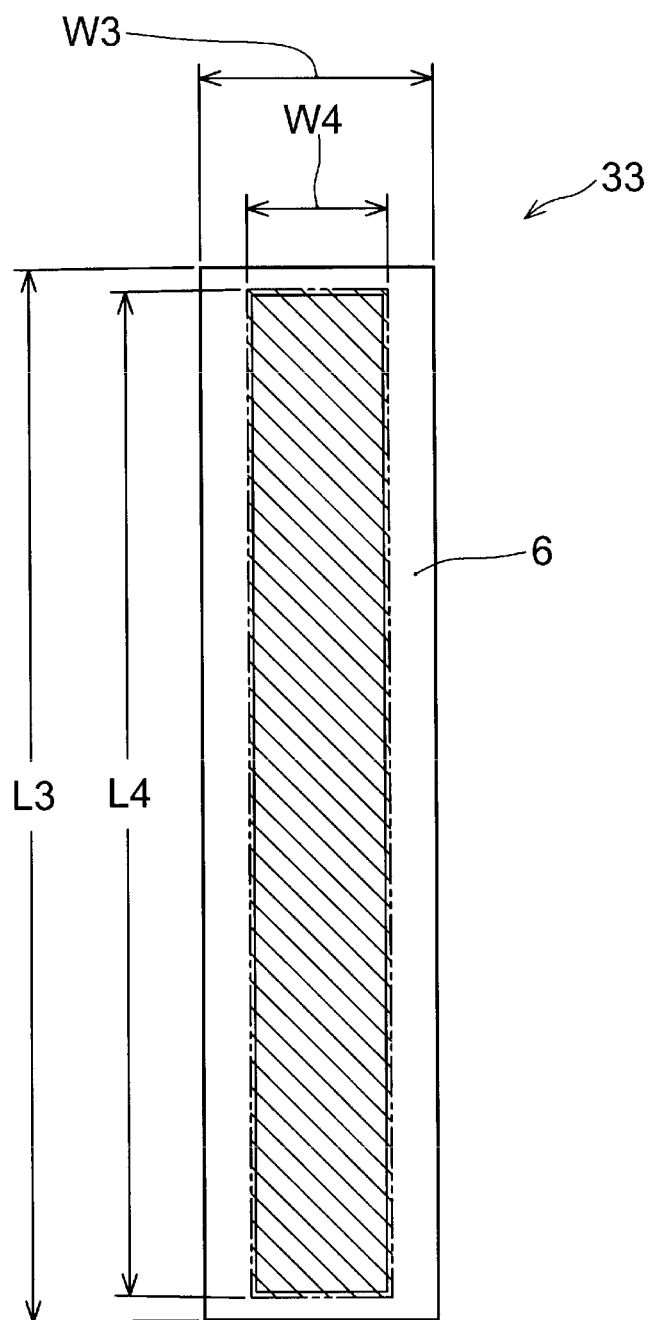
FIG. 6B is a diagram showing a region of the organic layer in the third sub-pixel, the region being formed with thicknesses of 95% or larger of the maximum thickness of the organic layer, in the organic-EL display apparatus according to Embodiment 1.

A cross-sectional view of the first sub-pixel 31 as a representative of the first and second sub-pixels 31 and 32 is shown in the lower part of FIG. 6A, and a plan view of the first sub-pixel 31 is shown in the upper part of FIG. 6A. In the illustration in the upper part, the portion of the organic layer 6 having thicknesses equal to or larger than 95% of the maximum thickness TM (in FIG. 6A, a normal thickness) of the organic layer 6 is hatched (TN=0.95×TM in FIG. 6A). A plan view of the third sub-pixel 33 is shown in FIG. 6B. Similar to FIG. 6A, the portion of the organic layer 6 having thicknesses equal to or larger than 95% of the maximum thickness of the organic layer 6 is hatched. In the present embodiment, the ratio R1 of the area A2=L2×W2 of the hatched portion to the total area A1=L1×W1 of the first sub-pixel 31 is larger than the ratio R2 of the area A4=L4×W4 of the hatched portion to the total area A3=L3×W3 of the third sub-pixel 33, where L1 and W1 respectively denote the lengths of the long side and the short side of the first sub-pixel 31, L2 and W2 respectively denote the lengths of the long side and the short side of the portion having thicknesses equal to or larger than 95% of the maximum thickness in the first sub-pixel 31, L3 and W3 respectively denote the lengths of the long side and the short side of the third sub-pixel 33, and L4 and W4 respectively denote the lengths of the long side and the short side of the portion having thicknesses equal to or larger than 95% of the maximum thickness in the third sub-pixel 33.

The chromaticity irregularity between the area in which the organic layer 6 has thicknesses equal to or larger than 95% of the maximum thickness and the portion having the maximum thickness is unlikely to be sensed by visual observation. In this respect, it is desirable for each sub-pixel to have a high area ratio of a portion having thicknesses equal to or larger than 95% of the maximum thickness to the entirety of the sub-pixel. However, even in the case where the threshold for the thickness of the organic layer 6, which is significant with respect to the display characteristics, is a thickness other than 95% of the maximum thickness, the first and second sub-pixels 31 and 32 can have a higher area ratio of a portion having excellent display characteristics to the entirety of each sub-pixel than the third sub-pixel 33. Thus, according to the present embodiment, a portion having excellent display characteristics can be secured with a high area ratio to the entirety of each sub-pixel in a majority of sub-pixels (the first and second sub-pixels 31 and 32) in one pixel 2.

In the third sub-pixel 33, relatively large shadow portions S5 exist along the long sides. However, the influence of the shadow portions S5 can be reduced. For example, referring to FIGS. 3A to 3D again, the normal thickness T3 (see FIG. 3A) of the organic layer 6 in the third sub-pixel 33 is smallest among the at least three sub-pixels (the first to third sub-pixels 31, 32, and 33 in the example indicated in FIGS. 3A to 3D) comprised in each of the plurality of pixels 2. Therefore, the influence of the shadow portions S5 in the third sub-pixel 33 on the luminance and the like is small, for example, in comparison with a hypothetical case where the large shadow portions S2 and S4 exist along the long sides of the first and second sub-pixels 31 and 32.

That is, since the original thickness T3 of the organic layer 6 in the third sub-pixel 33 is small, the absolute values of the variations Δt5 and Δt6 in the thicknesses of the shadow portions S5 and S6 are relatively small even in the case where the variation ratios of the thicknesses of the organic layer 6 in the respective sub-pixels are the same. Specifically, the variation Δt5 in the thickness of the organic layer 6 in the shadow portions S5 along the long sides of the third sub-pixel 33 are smaller than the variations Δt2 and Δt4 in the thicknesses of the organic layer 6 in the shadow portions S2 and S4 along the short sides of the first and second sub-pixels 31 and 32. Since the variations in the thickness of the organic layer 6 affect the luminance and the like depending on the absolute values of the variations, the influence of the shadow portions S5 in the third sub-pixel 33 is small, compared with the case in which the first and second sub-pixels 31 and 32 comprise, along the long sides of the first and second sub-pixels 31 and 32, shadow portions having the same variation ratio as the shadow portions S5.

On the other hand, in the example shown in FIGS. 3A to 3D, the normal thickness of the organic layer 6 in the first sub-pixel 31 is largest among the at least three sub-pixels (the first to third sub-pixels 31, 32, and 33 in the example shown in FIGS. 3A to 3D) comprised in each of the plurality of pixels 2. In addition, the normal thickness of the organic layer 6 in the second sub-pixel 32 is smaller than the normal thickness of the organic layer 6 in the first sub-pixel 31, and is larger than the normal thickness of the organic layer 6 in the third sub-pixel 33. Since the large shadow portions S2 in the first sub-pixel 31 exist along the short sides of the first sub-pixel 31 as described before, the influence of the shadow portions S2 on the luminance and the like is small. Therefore, no significant problem occurs even in the case where the organic layer 6 in the first sub-pixel 31 is formed thick.

Since, in the present embodiment, the shadow portions S4 that is large exist in the second sub-pixel 32 along the short sides of the second sub-pixel 32, the influence of the shadow portions S4 on the luminance and the like is small. Therefore, unlike the example of FIGS. 3A to 3D, the organic layer 6 in the second sub-pixel 32 can be equal to or larger than the thickness of the organic layer 6 in the first sub-pixel 31. The thickness of the organic layer 6 in either of the first sub-pixel 31 and the second sub-pixel 32 can be largest among the at least three sub-pixels.

The first to third sub-pixels 31 to 33 preferably comprise a sub-pixel comprising a red luminescent material, a sub-pixel comprising a green luminescent material, and a sub-pixel comprising a blue luminescent material, such that light of all colors of red, green, and blue, which are the so-called three primary colors, can be emitted by the three sub-pixels. It is preferable that the thickness of the organic layer 6 correspond to the wavelength of the light emitted from the organic layer 6 such that the light emitted from the organic layer 6 is repeatedly reflected between the first electrode 5 and the second electrode 7 and, as a result, the intensity of light radiated in the directions perpendicular to the pixel surface is enhanced. The red, green, and blue light are in decreasing order of the wavelength. Therefore, in the case where the organic layer 6 in the first sub-pixel 31 has the largest thickness among the first to third sub-pixels 31, 32, and 33 as in the example of FIGS. 3A to 3D, it is preferable that the first sub-pixel 31 comprise a red luminescent material. In this case, it is preferable that the second sub-pixel 32 comprise a green luminescent material. Further, in the case where the organic layer 6 in the third sub-pixel 33 has the smallest thickness among the first to third sub-pixels 31, 32, and 33, it is preferable that the third sub-pixel 33 comprise a blue luminescent material. Furthermore, in the case where the organic layer 6 in the second sub-pixel 32 has a larger thickness than the organic layer 6 in the first sub-pixel 31 unlike the example of FIGS. 3A to 3D, the second sub-pixel 32 can comprise a red luminescent material, and the first sub-pixel 31 can comprise a green luminescent material. Moreover, in the case where the pixel 2 comprises four or more sub-pixels, the sub-pixel(s) other than the first to third sub-pixels 31, 32, and 33 can comprise a luminescent material which emits light of an arbitrary color. Examples of organic materials which emit light of each color of red, green, and blue light will be explained later.

Figure 3A:
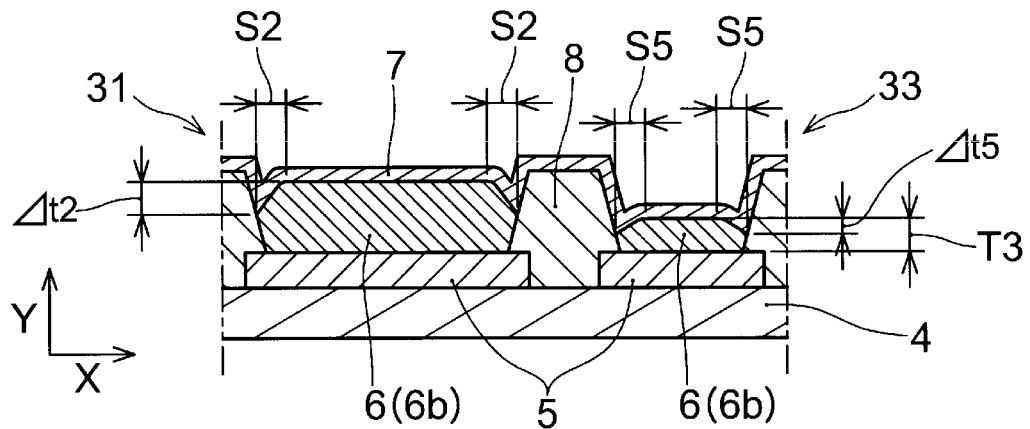
FIG. 3A is a cross-sectional view along a IIIA-IIIA line in FIG. 2.
Figure 3B:
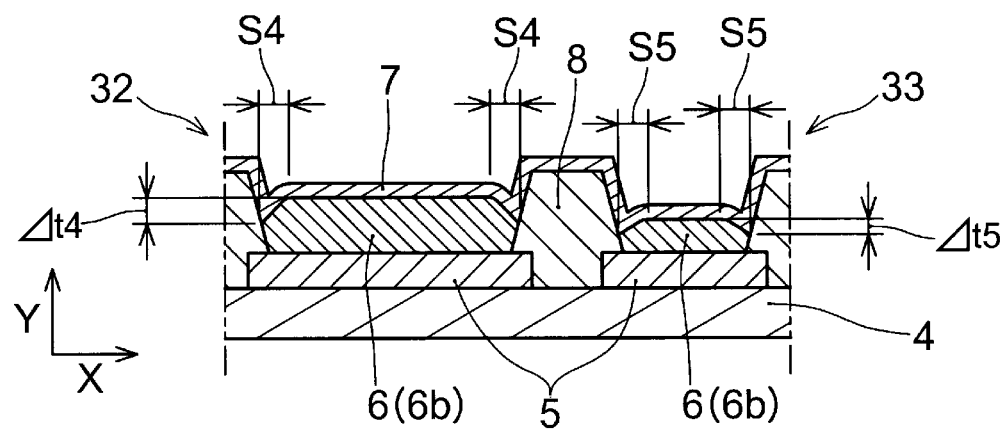
FIG. 3B is a cross-sectional view along a IIIB-IIIB line in FIG. 2.
Figure 3C:
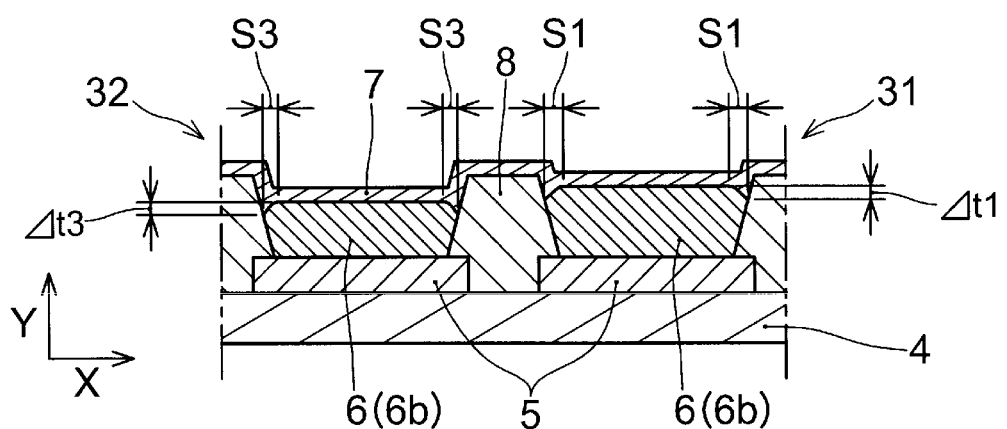
FIG. 3C is a cross-sectional view along a IIIC-IIIC line in FIG. 2.
Figure 3D:
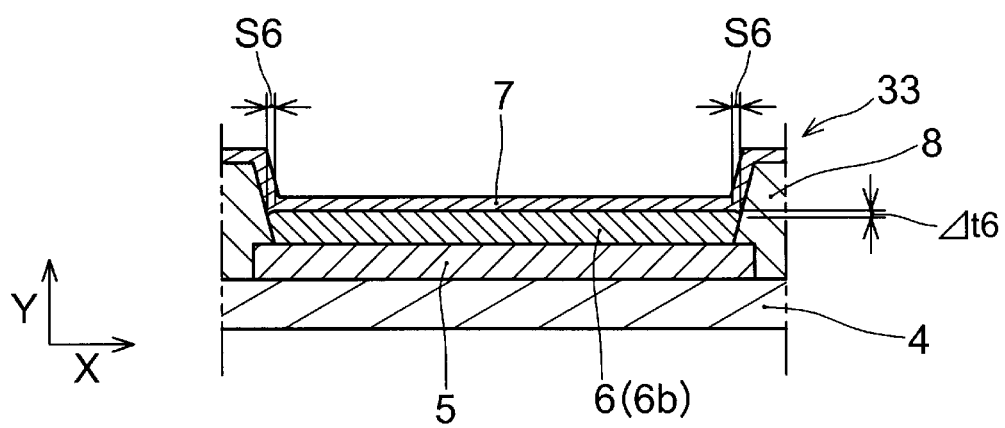
FIG. 3D is a cross-sectional view along a IIID-IIID line in FIG. 2.
Figure 4:
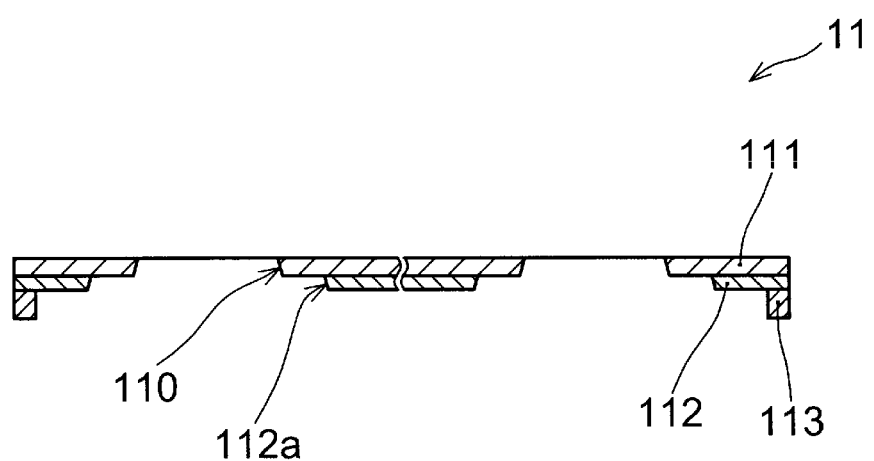
FIG. 4 is a cross-sectional view of an example of a vapor-deposition mask used for vapor deposition of an organic material in a manufacturing process for the organic-EL display apparatus.

The cross sections of the first to third sub-pixels 31, 32, and 33 illustrated in FIGS. 3A and 3B are more specifically shown in FIG. 7 than in FIGS. 3A and 3B. In FIG. 7, the cross sections of the first to third sub-pixels 31, 32, and 33 are arrayed for comparison of the thicknesses in the first to third sub-pixels 31, 32, and 33. As shown in FIG. 7, each of the first to third sub-pixels 31, 32, and 33 can have a multilayer structure. FIG. 7 shows a hole transport layer 6a, a light-emitting layer 6b, and an electron transport layer 6c, on the first electrode 5, as individual layers constituting the organic layer 6. In this case, the first electrode 5 is an anode, and the second electrode 7 is a cathode. Although not illustrated, the organic layer 6 can comprise a hole injection layer between the first electrode 5 (anode) and the hole transport layer 6a, and an electron injection layer between the second electrode 7 (cathode) and the electron transport layer 6c.

In the example shown in FIG. 7, the total thicknesses of the organic layer 6 in the first to third sub-pixels 31, 32, and 33 are differentiated from each other by differentiating the thickness of the light-emitting layer 6b and the hole transport layer 6a. For example, in the case where the first sub-pixel 31 comprises a red luminescent material, the thickness of the hole transport layer 6a in the first sub-pixel 31 is, for example, 60 nm or more and 200 nm or less, and the light-emitting layer 6b is, for example, 30 nm or more and 60 nm or less. In addition, the total thickness of the organic layer 6 in the first sub-pixel 31 is, for example, 120 nm or more and 290 nm or less, and, preferably, 170 nm or more and 250 nm or less. Further, in the case where the second sub-pixel 32 comprises a green luminescent material, the thickness of the hole transport layer 6a in the second sub-pixel 32 is, for example, 60 nm or more and 170 nm or less, and the thickness of the light-emitting layer 6b is, for example, 20 nm or more and 40 nm or less. In addition, the total thickness of the organic layer 6 in the second sub-pixel 32 is, for example, 110 nm or more and 240 nm or less, and, preferably, 140 nm or more and 220 nm or less. Furthermore, in the case where the third sub-pixel 33 comprises a blue luminescent material, the thickness of the hole transport layer 6a in the third sub-pixel 33 is, for example, 60 nm or more and 140 nm or less, and the thickness of the light-emitting layer 6b is, for example, 10 nm or more and 30 nm or less. In addition, the total thickness of the organic layer 6 in the third sub-pixel 33 is, for example, 100 nm or more and 200 nm or less, and preferably, 110 nm or more and 190 nm or less.

The relationship among the thicknesses of the organic layer 6 in the first to third sub-pixels 31, 32, and 33 as to which is larger or smaller is not construed to be limited to the example shown in FIG. 7. For example, the thicknesses of the organic layer 6 in all of the first to third sub-pixels 31, 32, and 33 can be identical. Furthermore, the thickness of the electron transport layer 6c and the thicknesses of the hole injection layer and the electron injection layer (which are not shown) can be different among the first to third sub-pixels 31, 32, and 33.

The hole transport layer 6a constituting the organic layer 6 is formed by using, for example, amine-type material such as triphenylamine. The light-emitting layer 6b is formed by using a material made by doping a host material such as $Alq_3$ or BAlq with a fluorescent dopant corresponding to the luminescence color, for example, DCM and DCJTB for red, "coumarin 6" for green, and perylene for blue. Alternatively, a phosphorescent dopant such as an iridium complex can be used as the dopant. Alternatively, thermally activated delayed fluorescence material (TADF material) can be used as the host or the dopant. The electron transport layer 6c is also formed by using $Alq_3$ or the like. In the case where the hole injection layer or the electron injection layer (which are not shown) are provided, the hole injection layer is formed by using, for example, amine-type compound or the like, and the electron injection layer is formed by using, for example, LiF or the like. Although LiF generally belongs to inorganic material, the thickness of the electron injection layer is also included in the thickness of the organic layer 6 arranged between the first electrode 5 and the second electrode 7 in the case where the electron injection layer is provided.

In the case where the first electrode 5 constitutes the anode, the first electrode 5 is formed of a material selected in consideration of, for example, relationship with the organic layer 6 or the like in a work function. For example, the first electrode 5 is formed with a combination of a metal film such as Ag or APC, and an ITO film. In addition, since the present embodiment is a top-emission type, the second electrode 7 is formed of a transparent material. In the case where the second electrode 7 constitutes a cathode, the second electrode 7 is formed by using, for example, a thin Mg—Ag eutectic film, a thin Al film, or the like. Further, the insulation bank 8 is formed by using, for example, a resin such as a polyimide resin or an acrylic resin. Although not shown, a protective film covering the second electrode 7 is formed by using, for example, $Si_3N_4$ or the like. The material forming the substrate 4 can be, for example, glass or a polyimide resin. Furthermore, although not shown, in a layer under the first electrode 5 on the substrate 4, a drive circuit is formed for each of the pixels 2. The drive circuit is constituted by a plurality of thin-film transistors and controls current supplied to the pixel 2.

Embodiment 2

Figure 8:
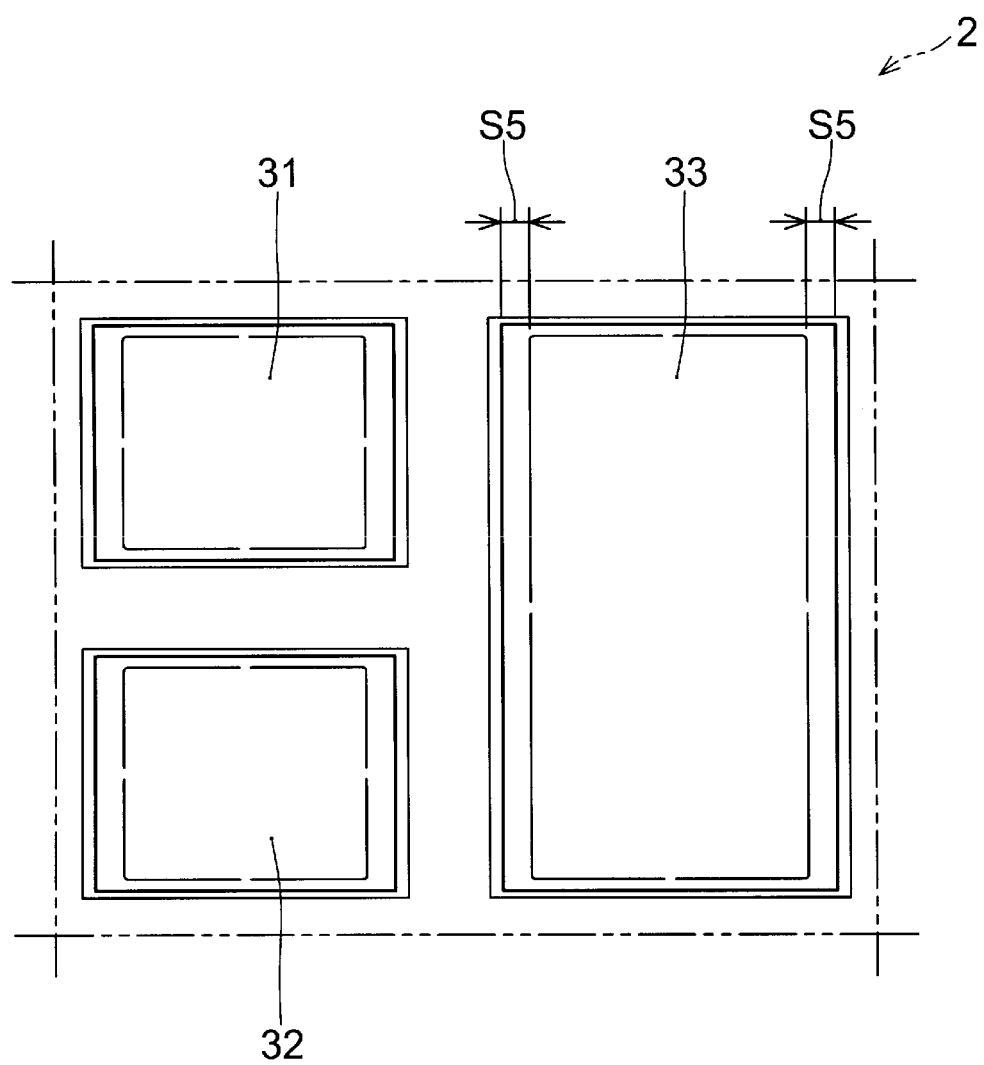
FIG. 8 is a plan view of a pixel in an organic-EL display apparatus according to Embodiment 2 of the present invention.

One of the plurality of pixels 2 constituting an organic-EL display apparatus according to Embodiment 2 is shown in FIG. 8. The plurality of pixels 2 each have a rectangular shape unlike Embodiment 1 described before. That is, the shape of each pixel 2 constituting the organic-EL display apparatus according to each embodiment is not construed to be limited to the square shape as long as the pixels 2 have a shape which can be arrayed in a matrix form.

Even in the present embodiment, each of the plurality of pixels 2 comprises three sub-pixels similar to Embodiment 1. In the example of FIG. 8, each of the plurality of pixels 2 comprises a first sub-pixel 31, a second sub-pixel 32, and a third sub-pixel 33. In addition, in the present embodiment, the area of the third sub-pixel 33 is larger than the area of the first sub-pixel 31 and the area of the second sub-pixel 32.

Like Embodiment 1, the third sub-pixel 33 comprises relatively large shadow portions S5 along the long sides of the third sub-pixel 33. In addition, like Embodiment 1, the third sub-pixel 33 preferably comprises a blue luminescent material, and can therefore have an organic layer 6 with a small original design thickness (see FIG. 3A). Thus, the volume of the organic layer 6 in the third sub-pixel 33 can be smaller than the organic layer 6 in the first and second sub-pixels 31 and 32, and the luminance of light emitted by the third sub-pixel 33 or the lifetime of the organic layer 6 in the third sub-pixel 33 can decrease in some cases. However, as in the present embodiment, the volume of the organic layer 6 in the third sub-pixel 33 can be increased by making the area of the third sub-pixel 33 larger than the area of the first sub-pixel 31 and the area of the second sub-pixel 32, so that the luminous characteristics and the lifetime of the third sub-pixel 33 can be improved. In the present embodiment, the structures and the materials, other than the shape of the pixels 2 and the area of the third sub-pixel 33, are similar to Embodiment 1 described before, and are therefore not described again.

Manufacturing Method

Next, a method for manufacturing organic-EL display apparatus according to Embodiment 1 is explained. In the method for manufacturing organic-EL display apparatus according to the present embodiment, a well-known technique is used except for a preparation step for vapor-deposition masks and steps of vapor-depositing organic materials on a target substrate for vapor deposition using the vapor-deposition masks. Therefore, only the preparation step for vapor-deposition masks and the steps for vapor deposition are described below.

Figure 9A:
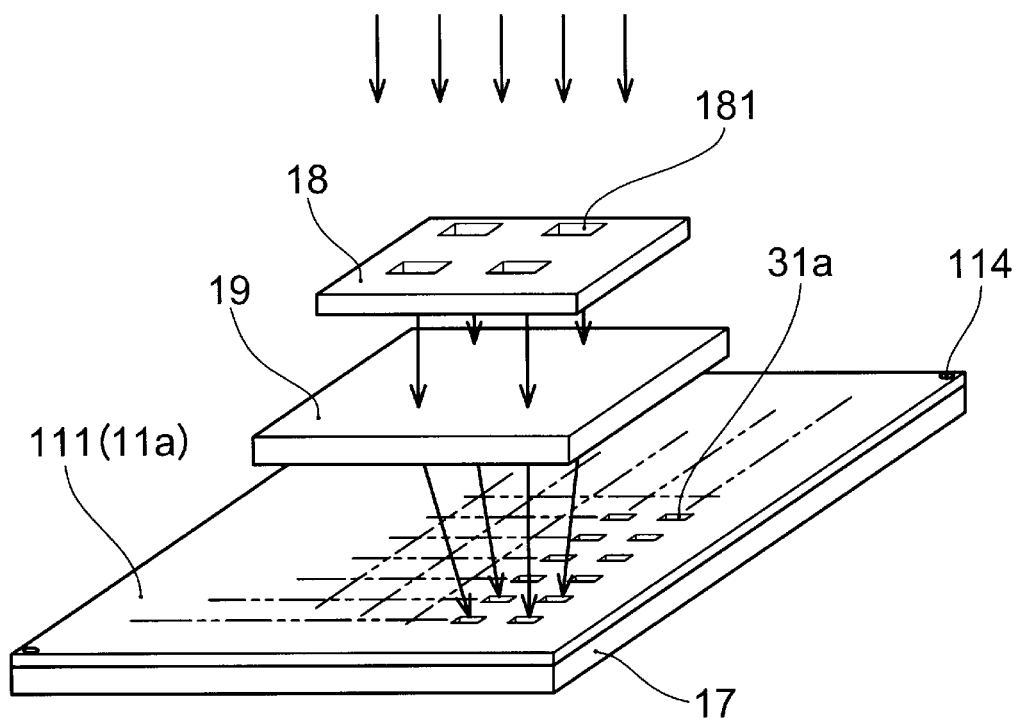
FIG. 9A is a diagram showing an example of a preparation process for a first vapor-deposition mask in a method for manufacturing organic-EL display apparatus according to Embodiment 1 of the present invention.
Figure 9B:
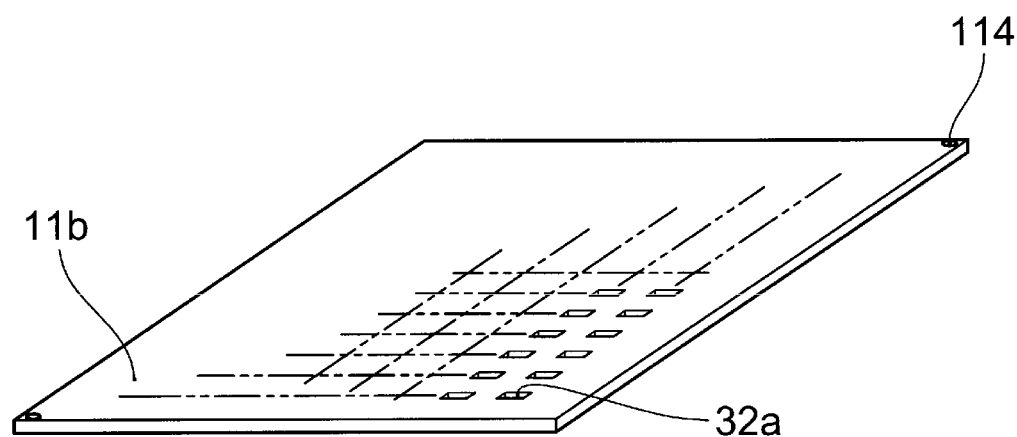
FIG. 9B is a diagram showing an example of a second vapor-deposition mask prepared by the method for manufacturing organic-EL display apparatus according to Embodiment 1 of the present invention.
Figure 9C:
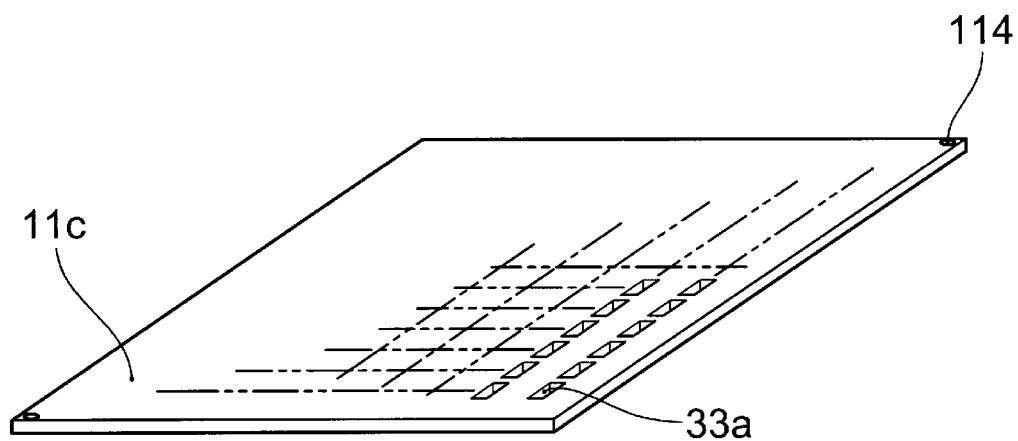
FIG. 9C is a diagram showing an example of a third vapor-deposition mask prepared by the method for manufacturing organic-EL display apparatus according to Embodiment 1 of the present invention.

The method for manufacturing organic-EL display apparatus according to the present embodiment comprises preparing a first vapor-deposition mask 11a provided with first openings 31a having a substantially rectangular shape, a second vapor-deposition mask 11b provided with second openings 32a having a substantially rectangular shape, and a third vapor-deposition mask 11c provided with third openings 33a having a substantially rectangular shape (see FIGS. 9A to 9C). The method for manufacturing organic-EL display apparatus according to the present embodiment further comprises overlapping the first to third vapor-deposition masks 11a, 11b, and 11c on a surface of a substrate (target substrate for vapor deposition) 4 in sequence, positioning above a linear evaporation source 16 the first to third vapor-deposition masks 11a, 11b, and 11c each overlapped on the substrate 4, and vapor-depositing organic materials 61 from the linear evaporation source 16 on the surface of the target substrate for vapor deposition 4, in sequence (see FIGS. 11A to 11C). In the vapor deposition using the first vapor-deposition mask 11a or the second vapor-deposition mask 11b, the first vapor-deposition mask 11a is arranged such that the long sides of the first openings 31a and the longitudinal direction of the linear evaporation source 16 are substantially parallel, and the second vapor-deposition mask 11b is arranged such that the long sides of the second openings 32a and the longitudinal direction of the linear evaporation source 16 are substantially parallel. In addition, in the vapor deposition using the third vapor-deposition mask 11c, the third vapor-deposition mask 11c is arranged such that the short sides of the third openings 33a and the longitudinal direction of the linear evaporation source 16 are substantially parallel. Hereinbelow, the steps of preparing the first to third vapor-deposition masks 11a, 11b, and 11c and the steps of vapor-depositing the organic materials 61 are further explained with reference to FIGS. 9A to 11C.

An example of a step of preparing the first vapor-deposition mask 11a is shown in FIG. 9A. As shown in FIG. 9A, the first openings 31a are formed in a resin film 111 of a polyimide resin or the like having a thickness of substantially 3 to 10 µm. The resin film 111 is formed, for example, by applying a liquid polyimide resin to a dummy substrate 17 by slit coating or spin coating, and baking the resin at the temperature of substantially 450° C. The resin film 111 can be formed using a material other than the polyimide resin, such as PEN, PET, COP, COC, or PC. In addition, the baking of the liquid polyimide resin can be performed by stepwisely varying the baking temperature. Although not shown in FIG. 9A, a metal support layer 112 (see FIG. 4) can be provided on a surface, opposite to the dummy substrate 17, of the resin film 111 by vapor deposition, sputtering, lamination of a metal foil, or the like. In that case, openings 112a (see FIG. 4) are formed in the metal support layer 112 by etching or the like.

The first openings 31a are formed by irradiating with laser light the resin film 111 attached to the dummy substrate 17. The resin film 111 is irradiated with the laser light, for example, through a mask 18 for laser light and an optical lens 19 as illustrated in FIG. 9A. The mask 18 for laser light comprises patterns 181 for the first openings. The laser light passing through the patterns 181 for the first openings is collected by the optical lens 19, and reaches the resin film 111. Portions of the resin film 111 that are irradiated with the laser light are burned off. As a result, the first openings 31a are formed in the resin film 111. A device for emitting the laser light is moved by a stepper, so that a given number of first openings 31a are formed in the resin film 111. Although the optical lens 19 is not necessarily required, the optical lens 19 is effective in enhancing the irradiation energy density at the processed surface.

As needed, a frame 113 (see FIG. 4) is adhered, by using an epoxy adhesive or the like, to the peripheral edge of the resin film 111 in which the first openings 31a are formed. Thereafter, the resin film 111 is peeled off from the dummy substrate 17 to complete the preparation of the first vapor-deposition mask 11a.

The second vapor-deposition mask 11b and the third vapor-deposition mask 11c respectively shown in FIGS. 9B and 9C are prepared in manners similar to the manner in which the first vapor-deposition mask 11a is prepared. The first openings 31a in the first vapor-deposition mask 11a and the second openings 32a in the second vapor-deposition mask 11b are formed such that the long-side directions of the respective openings can be parallel to the longitudinal direction of the linear evaporation source 16 when organic materials 61 (see FIGS. 11A to 11C) are vapor-deposited. In addition, the third openings 33a in the third vapor-deposition mask 11c are formed such that the short-side directions of the respective third openings can be parallel to the longitudinal direction of the linear evaporation source 16 when an organic material 61 is vapor-deposited.

For example, it is supposed that all of the first to third vapor-deposition masks 11a to 11c have a rectangular planar shape, and each vapor-deposition mask is set in a vapor-deposition apparatus (not shown) such that the long-side direction of each vapor-deposition mask is orthogonal to the longitudinal direction of the linear evaporation source 16. In such a case, the first openings 31a and the second openings 32a are formed such that the longitudinal direction of each opening is perpendicular to the longitudinal direction of the corresponding one of the first vapor-deposition mask 11a and the second vapor-deposition mask 11b. In addition, the third openings 33a are formed such that the longitudinal directions of the third openings 33a are parallel to the longitudinal direction of the third vapor-deposition mask 11c. On the other hand, in the case where each vapor-deposition mask is set in the vapor-deposition apparatus such that the long-side direction of each vapor-deposition mask is parallel to the longitudinal direction of the linear evaporation source 16, the third openings 33a are formed such that the longitudinal directions of the third openings 33a are orthogonal to the longitudinal direction of the third vapor-deposition mask 11c. In addition, the first openings 31a and the second openings 32a are formed such that the longitudinal direction of each opening is parallel to the longitudinal direction of the corresponding one of the first vapor-deposition mask 11a and the second vapor-deposition mask 11b.

Alternatively, the first openings 31a and the second openings 32a can be formed such that the first openings 31a and the second openings 32a are arrayed in parallel and the long sides of the first openings 31a and the second openings 32a are substantially parallel when the first to third vapor-deposition masks 11a to 11c are overlapped each other in such a way as to align the longitudinal directions of each vapor-deposition mask or in such a way as to align the positions of the fiducial marks 114 on each vapor-deposition mask. On the other hand, the third openings 33a can be formed such that the long sides of the third openings 33a are substantially parallel to the short sides of the first openings 31a and the short sides of the second openings 32a when the first to third vapor-deposition masks 11a to 11c are overlapped each other in such a way as to align the longitudinal directions of each vapor-deposition mask or in such a way as to align the positions of the fiducial marks 114 on each vapor-deposition mask.

The condition for the laser-light irradiation is appropriately selected according to the material and thickness of the resin film 111 to be processed and the dimensions and shapes of the first to third openings 31a, 32a, and 33a to be formed. Generally, the laser-light irradiation is performed under the conditions that the pulse frequency of the laser light is 1 Hz or more and 60 Hz or less, the pulse width is 1 nanosecond or more and 15 nanoseconds or less, and the energy density per one pulse of the laser light at the surface to be irradiated is 0.01 J/cm$^2$ or more and 1 J/cm$^2$ or less. For example, YAG laser, excimer laser, He—Cd laser, or other laser-light sources can be used as the laser-light source.

It is preferable that the dimensions of the first to third openings 31a, 32a, and 33a decrease, from a surface of the resin film 111 facing the linear evaporation source 16 in the steps of vapor deposition (see FIGS. 11A to 11C), toward the opposite surface of the resin film 111 facing the target substrate for vapor deposition 4. That is, it is preferable that the first to third openings 31a, 32a, and 33a be formed in tapered shapes. The first to third openings 31a, 32a, and 33a having such tapered shapes are formed, for example, by forming in the laser mask 18 the respective patterns for the openings (e.g., the patterns 181 for the first openings) in such a manner that the transmittance of the laser light decreases in the vicinity of the peripheral edges of the patterns are approached.

The first openings 31a, the second openings 32a, and the third openings 33a are openings through which the organic materials forming the organic layer 6 in the first sub-pixel 31, the second sub-pixel 32, and the third sub-pixel 33 (see FIGS. 3A to 3D) respectively pass during vapor deposition of the organic materials. Although not shown, a vapor-deposition mask which is provided with all of the first openings 31a, the second openings 32a, and the third openings 33a can be prepared, in addition to the vapor-deposition masks in each of which the first openings 31a only, the second openings 32a only, or the third openings 33a only are provided. That is, a vapor-deposition mask for use in vapor deposition of an organic material used in common for the organic layer 6 in each of the first to third sub-pixels 31, 32, and 33 (e.g., an organic material used for the electron transport layer) can be prepared. In this case, the first openings 31a and the second openings 32a are formed to be arrayed in parallel such that the long sides of the first openings 31a and the long sides of the second openings 32a are substantially parallel, and the third openings 33a are formed such that the long sides of the third openings 33a are substantially parallel to the short sides of the first openings 31a and the short sides of the second openings 32a. However, for the electron transport layer and the like, the vapor deposition can also be performed for each sub-pixel using the first to third vapor-deposition masks 11a to 11c in sequence. In addition, in manufacture of the organic-EL display apparatus, a plurality of organic-EL display apparatuses can be manufactured on a single substrate 4 (see FIG. 10), where the plurality of organic-EL display apparatuses are arrayed in the longitudinal and lateral directions on the substrate 4. In this case, in each of the first to third vapor-deposition masks 11a to 11c, a plurality of sets of the first openings 31a, the second openings 32a, or the third openings 33a, in the number of the pixels in each organic-EL display apparatus, are formed along the longitudinal and lateral directions, in correspondence with the array of the plurality of organic-EL display apparatuses to be manufactured using the single substrate for vapor deposition 4.

Figure 10:
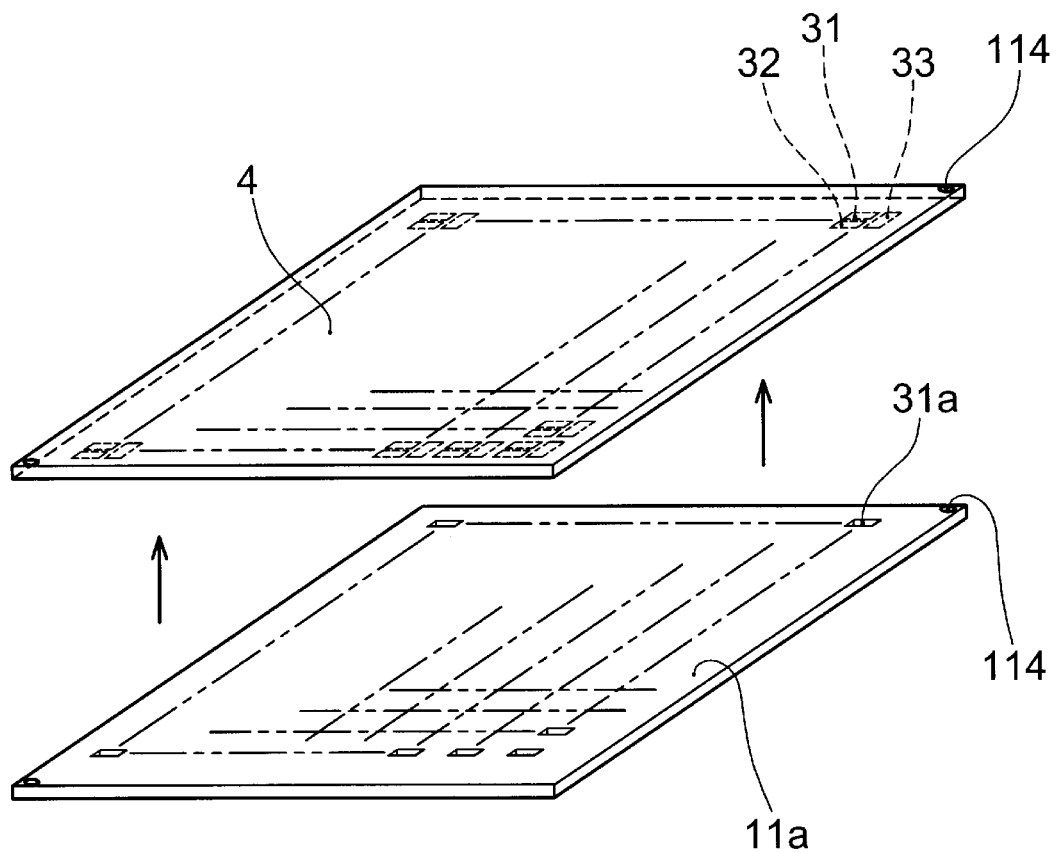
FIG. 10 is a diagram showing an example of arranging the first vapor-deposition mask above a target substrate for vapor deposition and aligning the first vapor-deposition mask to the substrate, in the method for manufacturing organic-EL display apparatus according to Embodiment 1 of the present invention.

As shown in FIG. 10, the target substrate for vapor deposition 4 is positioned above a surface of the first vapor-deposition mask 11a, and the first vapor-deposition mask 11a is overlapped with a surface of the target substrate for vapor deposition 4. Although not shown, a plurality of thin-film transistors constituting drive circuits for organic-EL display elements are formed in the target substrate for vapor deposition 4, and the first electrodes 5 (see FIG. 3A) are formed on a flattening layer provided over the drive circuits. In addition, the areas on which the organic layer 6 (see FIG. 3A) in each of the first to third sub-pixels 31, 32, and 33 is to be formed are partitioned by the insulation bank 8 (see FIG. 3A). As described before, a plurality of organic-EL display apparatuses, arrayed in parallel in the longitudinal and lateral directions, can be manufactured by using a single target substrate for vapor deposition 4. In this case, a plurality of sets of multiple areas for the first to third sub-pixels 31, 32, and 33 to be provided in each organic-EL display apparatus are partitioned, in correspondence with the array of the plurality of organic-EL display apparatuses, on the single target substrate for vapor deposition 4.

The positions of the first openings 31a in the first vapor-deposition mask 11a and the first sub-pixels 31 on the target substrate for vapor deposition 4 are aligned. This position alignment can be performed by image recognition of the first sub-pixels 31 and the first openings 31a, or by image recognition of the fiducial marks 114 that are respectively arranged on the target substrate for vapor deposition 4 and the first vapor-deposition mask 11a.

Figure 11A:
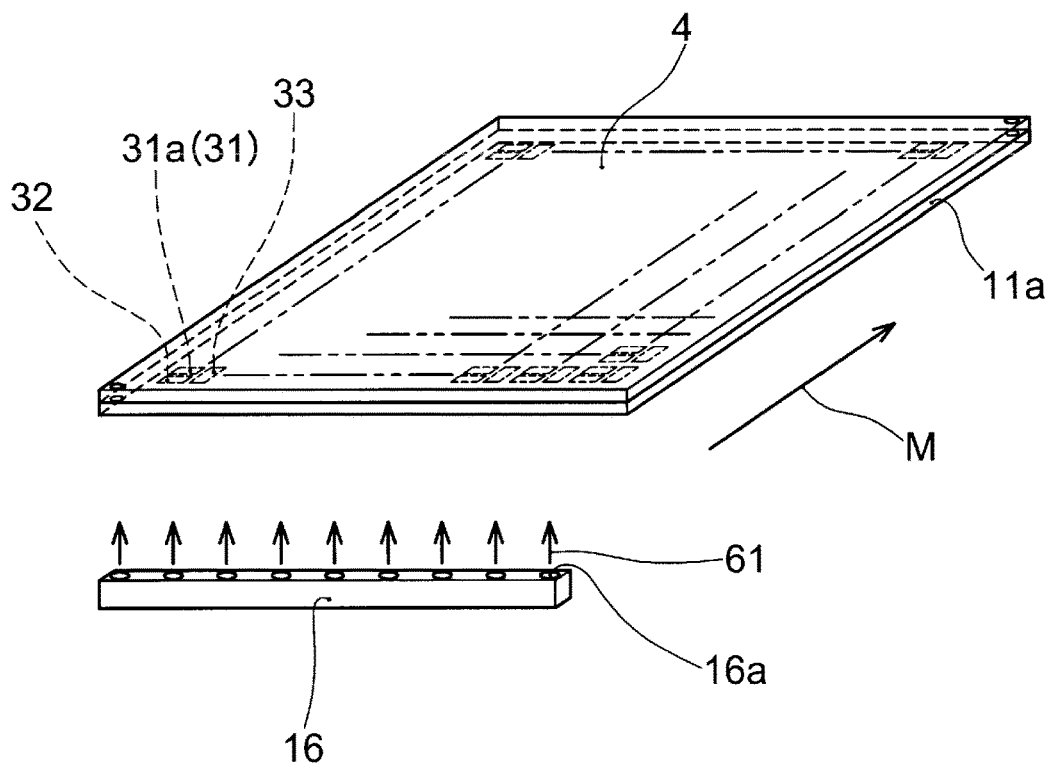
FIG. 11A is a diagram showing an example of vapor-depositing an organic material by using the first vapor-deposition mask in the method for manufacturing organic-EL display apparatus according to Embodiment 1 of the present invention.

Then, as shown in FIG. 11A, the first vapor-deposition mask 11a is positioned above the linear evaporation source 16 such that the long-side directions of the first openings 31a and the longitudinal direction of the linear evaporation source 16 are substantially parallel with each other. The linear evaporation source 16 is provided with the plurality of melting pots 16a arrayed along the longitudinal direction of the linear evaporation source 16. A vaporized or sublimed organic material 61 is scattered from each of the plurality of melting pots 16a toward the target substrate for vapor deposition 4, and is vapor-deposited on a surface of the target substrate for vapor deposition 4. During the vapor-deposition process, the linear evaporation source 16 is moved relative to the target substrate for vapor deposition 4 in a direction orthogonal to the longitudinal direction of the linear evaporation source 16 (the direction indicated with an arrow M in FIG. 11A). When the linear evaporation source 16 moves by a moving distance corresponding to the length of the target substrate for vapor deposition 4 in the moving direction of the linear evaporation source 16, the vapor deposition of the organic material 61 over the entire surface of the target substrate for vapor deposition 4 (excluding the areas masked by the first vapor-deposition mask 11a) is completed. In other words, the organic material 61 is vapor-deposited on the first sub-pixels 31 on the entire surface of the target substrate for vapor deposition 4.

Vapor deposition of an organic material 61 using the second vapor-deposition mask 11b (see FIG. 9B) is also performed in a similar manner to the vapor deposition using the first vapor-deposition mask 11a. Specifically, the second vapor-deposition mask 11b is overlapped with the surface of the target substrate for vapor deposition 4, and the positions of the second openings 32a and the second sub-pixels 32 are aligned, in a similar manner to the example shown in FIG. 10 mentioned before. Then, the second vapor-deposition mask 11b is positioned above the linear evaporation source 16 such that the long-side directions of the second openings 32a and the longitudinal direction of the linear evaporation source 16 are substantially parallel with each other as shown in FIG. 11B, and the organic material 61 from the linear evaporation source 16 is vapor-deposited on the surface of the target substrate for vapor deposition 4.

Further, vapor deposition of an organic material 61 using the third vapor-deposition mask 11c (see FIG. 9C) is also performed in a similar manner to the vapor deposition using the first vapor-deposition mask 11a. Specifically, the third vapor-deposition mask 11c is overlapped with the surface of the target substrate for vapor deposition 4, and the positions of the third openings 33a and the third sub-pixel 33 are aligned, in a similar manner to the example shown in FIG. 10 mentioned before. Then, the third vapor-deposition mask 11c is positioned above the linear evaporation source 16 such that the short-side directions of the third openings 33a and the longitudinal direction of the linear evaporation source 16 are substantially parallel with each other as illustrated in FIG. 11C, and the organic material 61 from the linear evaporation source 16 is vapor-deposited on the surface of the target substrate for vapor deposition 4.

Figure 11B:
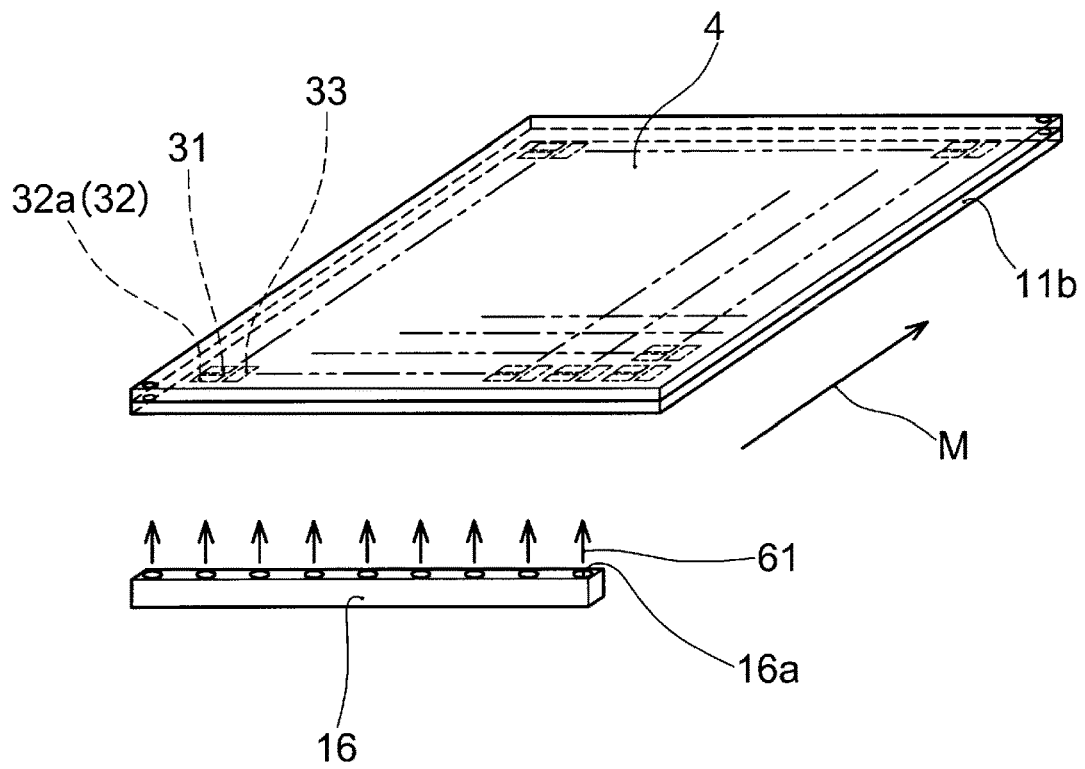
FIG. 11B is a diagram showing an example of vapor-depositing an organic material by using the second vapor-deposition mask in the method for manufacturing organic-EL display apparatus according to Embodiment 1 of the present invention.
Figure 11C:
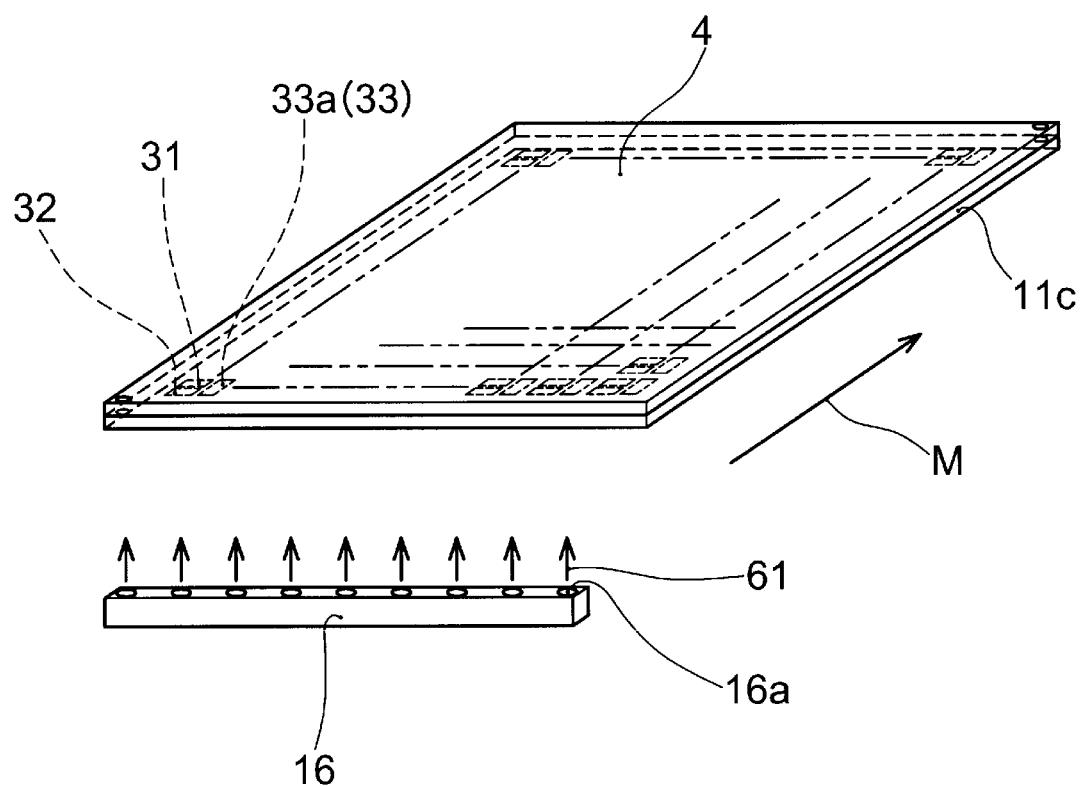
FIG. 11C is a diagram showing an example of vapor-depositing an organic material by using the third vapor-deposition mask in the method for manufacturing organic-EL display apparatus according to Embodiment 1 of the present invention.

During the vapor deposition illustrated in FIGS. 11A to 11C, as described before, relatively large shadow portions occur along the sides, perpendicular to the longitudinal direction of the linear evaporation source 16, of each of the first to third sub-pixels 31, 32, and 33. On the other hand, only relatively small shadow portions occur along the sides, parallel to the longitudinal direction of the linear evaporation source 16, of each of the first to third sub-pixels 31, 32, and 33. That is, only relatively small shadow portions S1 and S3 (see FIG. 2) occur along the long sides of the first and second sub-pixels 31 and 32, and relatively large shadow portions S5 (see FIG. 2) occur along the long sides of the third sub-pixel 33.

The vapor depositions using the first to third vapor-deposition masks 11a to 11c can be performed in an arbitrary order. In addition, a vapor deposition using a vapor-deposition mask other than the first to third vapor-deposition masks 11a to 11c is appropriately performed as needed. As a result, the organic layer 6 (see FIG. 3A) consisting of the organic materials 61 each vapor-deposited in the first to third sub-pixels 31, 32, and 33 are formed.

Thereafter, the second electrode 7 (see FIG. 3A) is formed over the entire surface by a method such as vacuum deposition or sputtering, and a protective layer (not shown) is formed over the second electrode 7. Then, the target substrate for vapor deposition 4 is divided, and, preferably, the entirety of each of pieces respectively comprising the divided portions of the substrate is sealed with a sealing layer (not shown) of glass, a resin film, or the like. Further, a source driver, a gate driver, and the like for supplying drive signals and electric power to the aforementioned drive circuits are provided. The organic-EL display apparatus is completed, for example, through the above steps of operations.

SUMMARY

An organic-EL display apparatus according to a first aspect of the present invention comprises: a substrate comprising a first electrode; an organic layer formed of organic materials so as to form a plurality of pixels arrayed in a matrix form, the organic material being vapor-deposited on the first electrode; and a second electrode formed on the organic layer, wherein each of the plurality of pixels comprises at least three sub-pixels having substantially rectangular shapes; a first sub-pixel and a second sub-pixel among the at least three sub-pixels are arranged in parallel with each other such that a long side of the first sub-pixel and a long side of the second sub-pixel are substantially parallel with each other; a third sub-pixel among the at least three sub-pixels is formed such that a long side of the third sub-pixel is substantially parallel with a short side of the first sub-pixel and a short side of the second sub-pixel; in the first sub-pixel and the second sub-pixel, a variation in a thickness of the organic layer through a long-side direction is larger than a variation in the thickness of the organic layer through a short-side direction; and in the third sub-pixel, a variation in a thickness of the organic layer through a short-side direction is larger than a variation in the thickness of the organic layer through a long-side direction.

According to the configuration of the first aspect of the present invention, it is possible to facilitate manufacture of the sub-pixels and to reduce influence, on the display quality, of a variation in the thickness of the organic layer.

In the organic-EL display apparatus according to a second aspect of the present invention, in the above-mentioned first aspect 1, the area of the third sub-pixel can be larger than the area of the first sub-pixel and the area of the second sub-pixel.

According to the configuration of the second aspect of the present invention, it is possible to improve the luminous characteristics and the lifetime of the third sub-pixel.

In the organic-EL display apparatus according to a third aspect of the present invention, in the above-mentioned first or second aspect, the at least three sub-pixels can comprise a sub-pixel comprising a red luminescent material, a sub-pixel comprising a green luminescent material, and a sub-pixel comprising a blue luminescent material, and the first sub-pixel or the second sub-pixel can comprise the red luminescent material.

According to the configuration of the third aspect of the present invention, it is possible to reduce influence of the shadow portions in the sub-pixels emitting red light even in the case where the thickness of the organic layer is set large in order to obtain an optical resonance effect.

In the organic-EL display apparatus according to a fourth aspect of the present invention, in the above-mentioned third aspect, the third sub-pixel can comprise the blue luminescent material.

According to the configuration of the fourth aspect of the present invention, it is possible to reduce influence of the shadow portions in the third sub-pixel while benefiting from the optical resonance effect.

In the organic-EL display apparatus according to a fifth aspect of the present invention, in the above-mentioned first or second aspect, the thickness of the organic layer in the first sub-pixel or the second sub-pixel can be largest among the at least three sub-pixels comprised in each of the plurality of pixels.

According to the configuration of the fifth aspect of the present invention, it is possible to reduce influence of the shadow portions in the sub-pixels having an organic layer with a large thickness.

In the organic-EL display apparatus according to a sixth aspect of the present invention, in the above-mentioned first or second aspect, the thickness of the organic layer in the third sub-pixel can be smallest among the at least three sub-pixels comprised in each of the plurality of pixels.

According to the configuration of the sixth aspect of the present invention, it is possible to reduce influence of the shadow portions in the third sub-pixel.

In the organic-EL display apparatus according to a seventh aspect of the present invention, in any one of the above-mentioned aspects 1 to 6, an area ratio in the first sub-pixel and an area ratio in the second sub-pixel can be larger than an area ratio in the third sub-pixel, each of the area ratios in the first to third sub pixels being defined as a ratio of an area of a portion to the entire area of each of the first to third sub pixels, the portion having thicknesses equal to or larger than 95% of the maximum thickness of the organic layer in each of the first to third sub-pixels.

According to the configuration of the seventh aspect of the present invention, it is possible to obtain pixels having excellent luminous characteristics.

A method for manufacturing organic-EL display apparatus according to one aspect of the present invention comprises: preparing a first vapor-deposition mask provided with a first opening having a substantially rectangular shape, a second vapor-deposition mask provided with a second opening having a substantially rectangular shape, and a third vapor-deposition mask provided with a third opening having a substantially rectangular shape; overlapping the first vapor-deposition mask with a surface of a target substrate for vapor deposition, positioning the first vapor-deposition mask above a linear evaporation source such that a long side of the first opening and a longitudinal direction of the linear evaporation source are substantially parallel with each other, and vapor-depositing, on the surface, an organic material from the linear evaporation source; overlapping the second vapor-deposition mask with the surface of the target substrate for vapor deposition, positioning the second vapor-deposition mask above the linear evaporation source such that a long side of the second opening and the longitudinal direction of the linear evaporation source are substantially parallel with each other, and vapor-depositing, on the surface, an organic material from the linear evaporation source; and overlapping the third vapor-deposition mask with the surface of the target substrate for vapor deposition, positioning the third vapor-deposition mask above the linear evaporation source such that a short side of the third opening and the longitudinal direction of the linear evaporation source are substantially parallel with each other, and vapor-depositing, on the surface, an organic material from the linear evaporation source.

According to the method for manufacturing organic-EL display apparatus of the one aspect of the present invention, it is possible to easily manufacture an organic-EL display apparatus in which the display quality and the like is less affected by a variation in the thickness of the organic layer.

DESCRIPTION OF REFERENCE NUMERAL

1 Organic-EL display apparatus
2 Pixel
31 First sub-pixel
31a First opening
32 Second sub-pixel
32a Second opening
33 Third sub-pixel
33a Third Opening
4 Substrate (Target substrate for vapor deposition)
5 First electrode
6 Organic layer
61 Organic material
7 Second electrode
11 Vapor-deposition mask
11a First vapor-deposition mask
11b Second vapor-deposition mask
11c Third vapor-deposition mask
16 Linear evaporation source
Δt1 Variation in thickness of first sub-pixel in short-side direction
Δt2 Variation in thickness of first sub-pixel in long-side direction
Δt3 Variation in thickness of second sub-pixel in short-side direction
Δt4 Variation in thickness of second sub-pixel in long-side direction
Δt5 Variation in thickness of third sub-pixel in short-side direction
Δt6 Variation in thickness of third sub-pixel in long-side direction
T3 Thickness of organic layer of third sub-pixel
TM Maximum thickness of organic layer
TN 95% of maximum thickness of organic layer

The invention claimed is:

1. An organic-EL display apparatus comprising:
a substrate comprising a first electrode;
an organic layer formed of organic materials so as to form a plurality of pixels arrayed in a matrix form, the organic material being vapor-deposited on the first electrode; and
a second electrode formed on the organic layer,
wherein each of the plurality of pixels comprises at least three sub-pixels comprising a first sub-pixel, a second sub-pixel, and a third sub-pixel;
the third sub-pixel has a longitudinal direction being along a first direction;

a length of the third sub-pixel in the first direction as a whole is longer than a length of each of the first sub-pixel and the second sub-pixel in the first direction; and in the third sub-pixel, a variation in a thickness of the organic layer through a second direction orthogonal to the first direction is larger than a variation in a thickness of the organic layer through the first direction.

2. The organic-EL display apparatus according to claim 1, wherein in at least one of the first sub-pixel and the second sub-pixel, a length in the second direction is longer than a length in the first direction.

3. The organic-EL display apparatus according to claim 1, wherein a variation in a thickness of the organic layer through the first direction in each of the first sub-pixel and the second sub-pixel is larger than the variation in the thickness of the organic layer through the first direction in the third sub-pixel.

4. The organic-EL display apparatus according to claim 1, wherein a variation in a thickness of the organic layer through the second direction in each of the first sub-pixel and the second sub-pixel is larger than the variation in the thickness of the organic layer through the second direction in the third sub-pixel.

5. The organic-EL display apparatus according to claim 1, wherein an area of the third sub-pixel is larger than an area of the first sub-pixel and an area of the second sub-pixel.

6. The organic-EL display apparatus according to claim 1, wherein the at least three sub-pixels comprise a sub-pixel comprising a red luminescent material, a sub-pixel comprising a green luminescent material, and a sub-pixel comprising a blue luminescent material, and the first sub-pixel or the second sub-pixel comprises the red luminescent material.

7. The organic-EL display apparatus according to claim 6, wherein the third sub-pixel comprises the blue luminescent material.

8. The organic-EL display apparatus according to claim 1, wherein a thickness of the organic layer in the first sub-pixel or the second sub-pixel is largest among the at least three sub-pixels comprised in each of the plurality of pixels.

9. The organic-EL display apparatus according to claim 1, wherein a thickness of the organic layer in the third sub-pixel is smallest among the at least three sub-pixels comprised in each of the plurality of pixels.

10. The organic-EL display apparatus according to claim 1, wherein an area ratio in the first sub-pixel and an area ratio in the second sub-pixel are larger than an area ratio in the third sub-pixel, each of the area ratios in the first to third sub-pixels being defined as a ratio of an area of a portion to an entire area of each of the first to third sub-pixels, the portion having thicknesses equal to or larger than 95% of a maximum thickness of the organic layer in each of the first to third sub-pixels.

11. A method for manufacturing an organic-EL display apparatus, comprising:

preparing a first vapor-deposition mask provided with a first opening, a second vapor-deposition mask provided with a second opening, and a third vapor-deposition mask provided with a third opening having a longitudinal direction;

forming an organic layer in a first sub-pixel on a target substrate for vapor deposition by overlapping the first vapor-deposition mask with a surface of the target substrate for vapor deposition, positioning the first vapor-deposition mask such that the first vapor-deposition mask faces a linear evaporation source, and vapor-depositing, on the surface, an organic material from the linear evaporation source;

forming an organic layer in a second sub-pixel on the target substrate for vapor deposition by overlapping the second vapor-deposition mask with the surface of the target substrate for vapor deposition, positioning the second vapor-deposition mask such that the second vapor-deposition mask faces the linear evaporation source, and vapor-depositing, on the surface, an organic material from the linear evaporation source; and forming an organic layer in a third sub-pixel on the target substrate for vapor deposition by overlapping the third vapor-deposition mask with the surface of the target substrate for vapor deposition, positioning the third vapor-deposition mask such that the third vapor-deposition mask faces the linear evaporation source, and vapor-depositing, on the surface, an organic material from the linear evaporation source, wherein forming the organic layer in the third sub-pixel comprises moving the linear evaporation source relative to the target substrate for vapor deposition in a first direction being along the longitudinal direction of the third opening; and the organic layer formed in the third sub-pixel is an organic layer in which a variation in a thickness through a second direction orthogonal to the first direction is larger than a variation in the thickness through the first direction.

12. The method for manufacturing an organic-EL display apparatus according to claim 11, wherein the first opening has a longitudinal direction; and forming the organic layer in the first sub-pixel comprises:

positioning the first vapor-deposition mask such that the first vapor-deposition mask faces the linear evaporation source and the longitudinal direction of the first opening is substantially parallel to the second direction, and moving the linear evaporation source relative to the target substrate for vapor deposition in the first direction.

13. The method for manufacturing an organic-EL display apparatus according to claim 11, wherein the second opening has a longitudinal direction; and forming the organic layer in the second sub-pixel comprises:

positioning the second vapor-deposition mask such that the second vapor-deposition mask faces the linear evaporation source and the longitudinal direction of the second opening is substantially parallel to the second direction, and moving the linear evaporation source relative to the target substrate for vapor deposition in the first direction.

* * * * *